United States Patent
Lin et al.

(10) Patent No.: US 12,501,670 B2
(45) Date of Patent: Dec. 16, 2025

(54) ISOLATION STRUCTURE FOR SEMICONDUCTOR DEVICE

(71) Applicant: TAIWAN SEMICONDUCTOR MANUFACTURING COMPANY, LTD., Hsinchu (TW)

(72) Inventors: Han-Yu Lin, Hsinchu (TW); Che-Chi Shih, Hsinchu (TW); Szu-Hua Chen, Hsinchu (TW); Kuan-Da Huang, Hsinchu (TW); Cheng-Ming Lin, Hsinchu (TW); Tze-Chung Lin, Hsinchu (TW); Li-Te Lin, Hsinchu (TW); Wei-Yen Woon, Hsinchu (TW); Pinyen Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 882 days.

(21) Appl. No.: 17/678,481

(22) Filed: Feb. 23, 2022

(65) Prior Publication Data
US 2023/0268386 A1     Aug. 24, 2023

(51) Int. Cl.
| | |
|---|---|
| *H10D 62/10* | (2025.01) |
| *H10D 30/01* | (2025.01) |
| *H10D 30/67* | (2025.01) |
| *H10D 64/01* | (2025.01) |

(Continued)

(52) U.S. Cl.
CPC ......... *H10D 62/116* (2025.01); *H10D 30/031* (2025.01); *H10D 30/6713* (2025.01); *H10D 30/6757* (2025.01); *H10D 62/118* (2025.01); *H10D 64/017* (2025.01); *H10D 84/0128* (2025.01); *H10D 84/013* (2025.01); *H10D 84/0151* (2025.01); *H10D 84/038* (2025.01)

(58) Field of Classification Search
CPC .............. H10D 62/116; H10D 30/031; H10D 30/6713; H10D 30/6757; H10D 62/118; H10D 64/017; H10D 84/0128; H10D 84/013; H10D 84/0151; H10D 84/038; H10D 64/252; H10D 84/903; H10D 18/60; H10D 84/0188; H10D 84/201; H02K 15/027; B65D 83/141; A61K 40/4218; A23B 2/783; H10F 77/955; H10H 20/826; B82Y 10/00
See application file for complete search history.

(56) References Cited

U.S. PATENT DOCUMENTS

| | | | |
|---|---|---|---|
| 12,148,836 B2 * | 11/2024 | Wang | H10D 30/031 |
| 2020/0105929 A1 * | 4/2020 | Zhang | H10D 64/017 |
| 2021/0296494 A1 * | 9/2021 | Xie | H10D 84/0193 |

(Continued)

OTHER PUBLICATIONS

Rare earth element (Year: 2020).*

(Continued)

*Primary Examiner* — Ratisha Mehta
*Assistant Examiner* — Taddeus J Kolb
(74) *Attorney, Agent, or Firm* — Birch, Stewart, Kolasch & Birch, LLP

(57) ABSTRACT

A device includes a first semiconductor structure, a second semiconductor structure, and an isolation structure which is disposed between the first and second semiconductor structures, and which includes a dielectric material having a dielectric constant higher than 8 and lower than 16. A method for manufacturing the device is also disclosed.

20 Claims, 22 Drawing Sheets

(51) Int. Cl.
  *H10D 84/01* (2025.01)
  *H10D 84/03* (2025.01)

(56) References Cited

U.S. PATENT DOCUMENTS

| | | | | |
|---|---|---|---|---|
| 2023/0178476 A1* | 6/2023 | Kang | ................ | H01L 21/76877 |
| | | | | 438/275 |
| 2023/0187532 A1* | 6/2023 | Hashemi | .............. | H10D 62/121 |
| | | | | 257/410 |
| 2023/0197778 A1* | 6/2023 | Xie | .................... | H10D 84/0193 |
| | | | | 257/288 |
| 2023/0197819 A1* | 6/2023 | Bouche | .............. | H10D 84/0151 |
| | | | | 257/401 |
| 2023/0207553 A1* | 6/2023 | Xie | ...................... | H10D 62/121 |

OTHER PUBLICATIONS https://www.mks.com/n/dielectric-thin-films#:~:text=Historically%2C%20the%20insulator%20used%20to,dielectric%20constant%20of%20about%203.9. (Tabulated properties originate from a textbook dated to 1986) (Year: 1986).*
https://www.azom.com/properties.aspx?ArticleID=53 (Year: 2001).*

* cited by examiner

ISOLATION STRUCTURE FOR SEMICONDUCTOR DEVICE

BACKGROUND

The semiconductor integrated circuit (IC) industry has, over the decades, experienced tremendous advancements and is still undergoing vigorous development. With dramatic advances in technology, the industry pays much attention on the development of small IC devices with high performance and low cost. However, due to miniaturization of IC devices, isolation between components in the IC devices, which affects structure stability, capacitance impact, and current leakage, becomes an issue that must be addressed to improve device stability. Therefore, improving isolation between components in the IC devices is a main pursuit of the industry.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A to 10A, 11 to 17A, and 18 to 21A are schematic views illustrating intermediate stages of the method in accordance with some embodiments of the present disclosure.

DETAILED DESCRIPTION

Figure 1A:
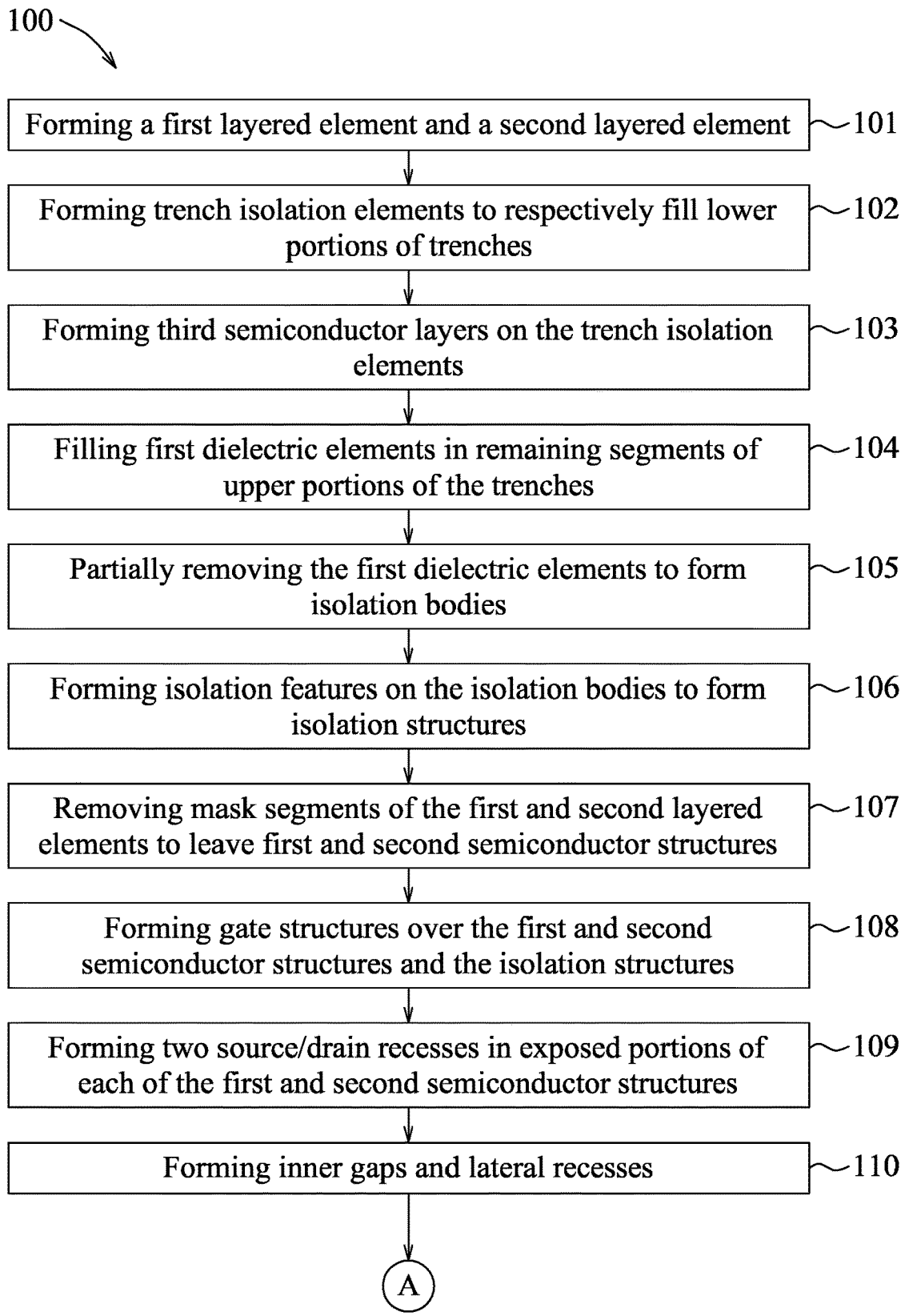
FIG. 1A is a flow diagram of a method for making a device in accordance with some embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "over," "below," "upper," "lower," "inner," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
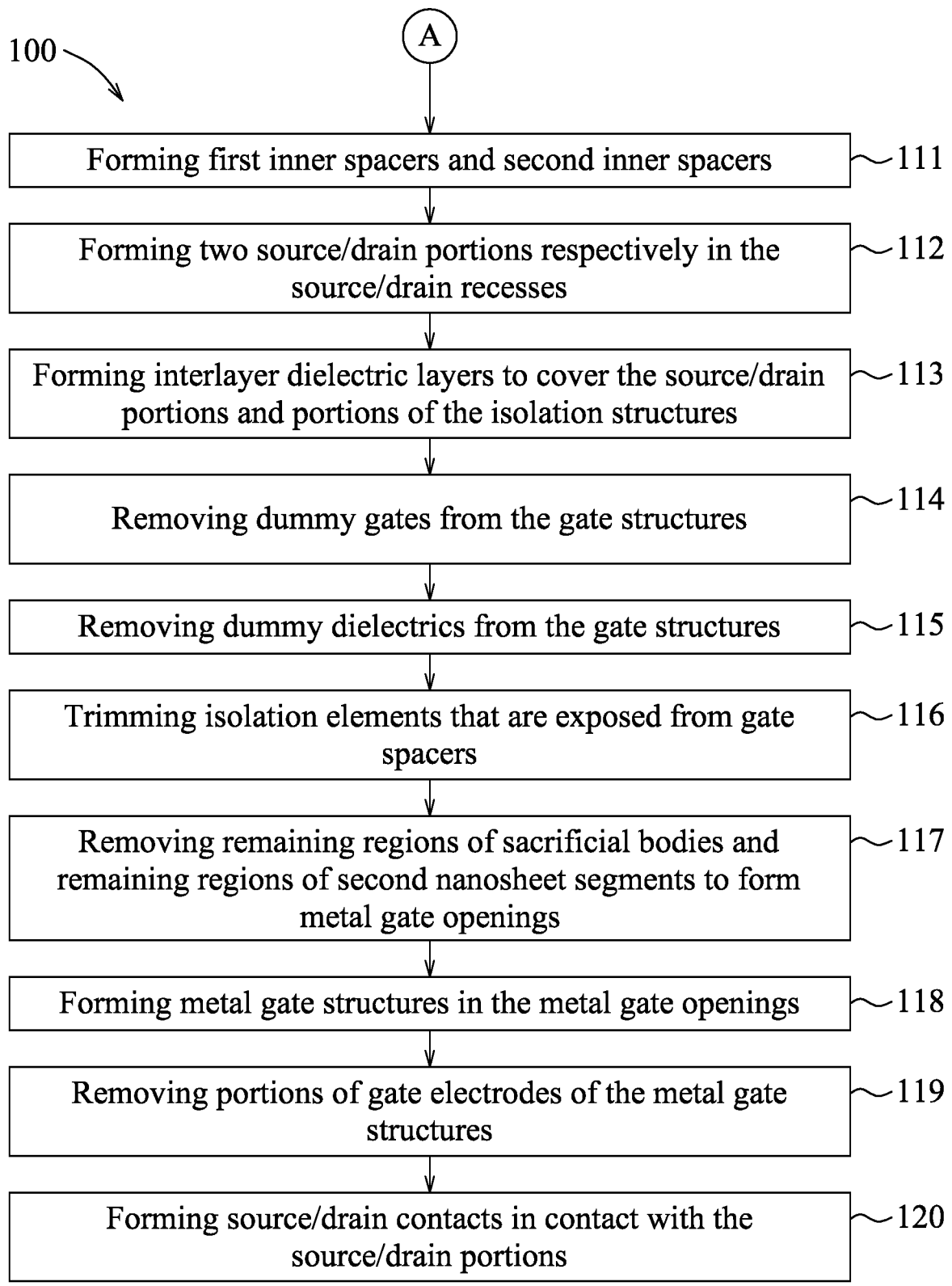
FIG. 1B is a continuation of the flow diagram of the method shown in FIG. 1A.

The present disclosure is directed to a device and a method for manufacturing the same. The device may be, for example, but not limited to, a memory device, a multi-gate device, or other suitable devices. FIGS. 1A and 1B are flow diagrams illustrating a method 100 for manufacturing the device (for example, but not limited to, a device 200A shown in FIGS. 21A and 21B) in accordance with some embodiments. FIGS. 2A to 21A illustrate schematic views of intermediate stages of the method 100. Some repeating structures are omitted in FIGS. 2A to 21B for the sake of brevity. Additional steps can be provided before, after or during the method 100, and some of the steps described herein may be replaced by other steps or be eliminated. In the exemplary method 100 according to the present disclosure, the device 200A is a multi-gate device.

Figure 2B:
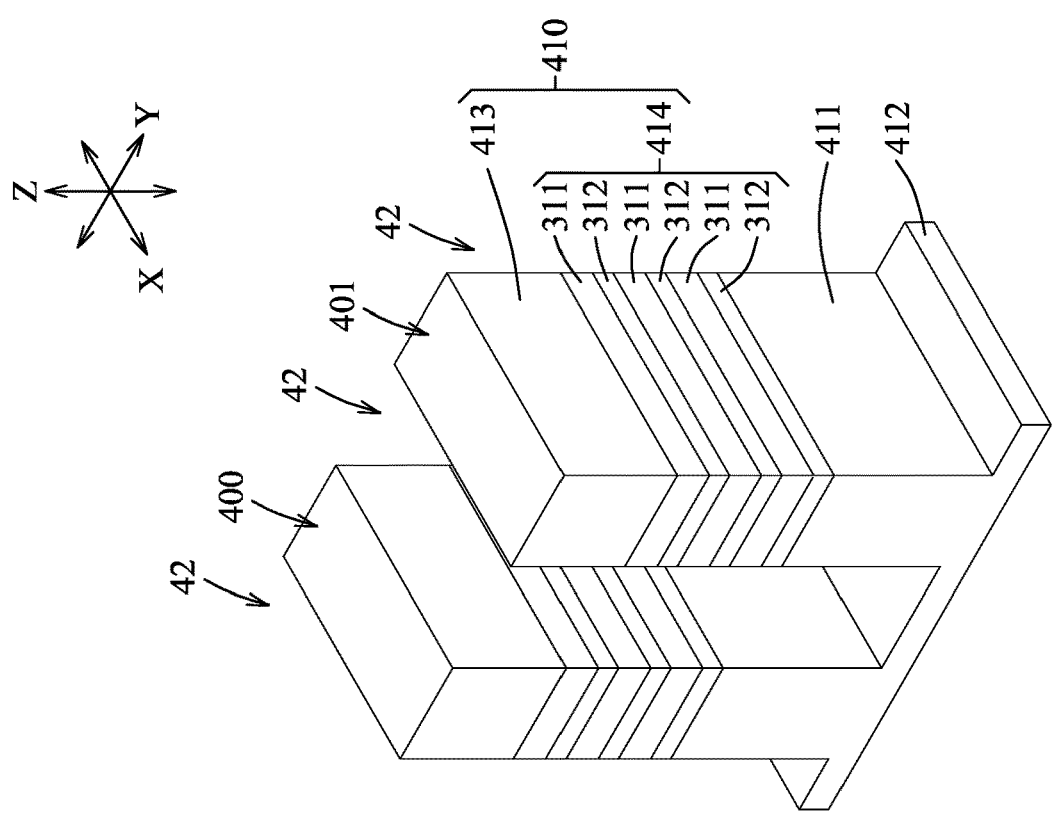
Figure 2A:
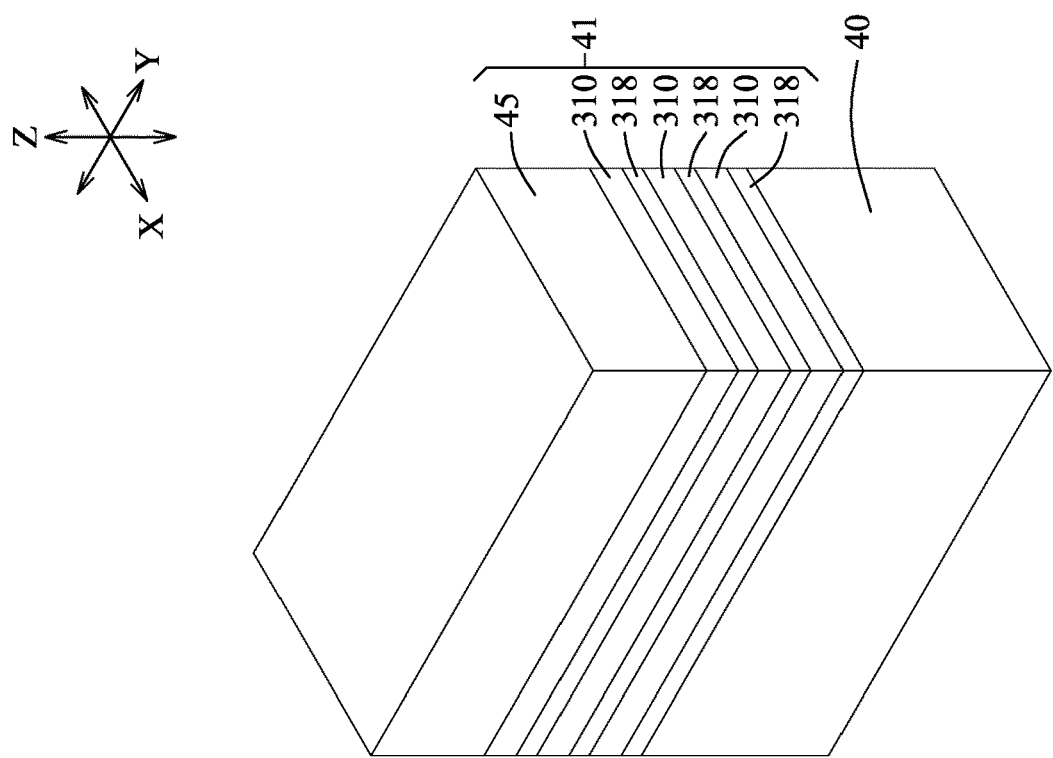

Referring to FIG. 1A and the examples illustrated in FIGS. 2A and 2B, the method 100 begins at step 101, where a first layered element 400 and a second layered element 401 are formed. In FIG. 2B, the first layered element 400 and the second layered element 401 are formed by patterning a stack of semiconductor layers 41 (hereinafter referred to as the stack 41) disposed on a substrate 40 and etching back the substrate 40. The substrate 40 and the stack 41 are shown in FIG. 2A.

The stack 41 has at least one first semiconductor layer 310 including a first semiconductor material, and at least one second semiconductor layer 318 disposed to alternate with the first semiconductor layer 310 and including a second semiconductor material. An uppermost one of the at least one first semiconductor layer 310 is disposed over an uppermost one of the at least one second semiconductor layer 318 such that an uppermost one of semiconductor layers in the stack 41 is the uppermost one of the at least one of the first semiconductor layer 310. The first and second semiconductor materials have different etch selectivity and/or oxidation rates. In some embodiments, the first semiconductor material may be the same material as that of the substrate 40. The first semiconductor layer 310 and the second semiconductor layer 318 may be intrinsic or doped with a p-type dopant or an n-type dopant. In some embodiments, the first semiconductor material is silicon, and the second semiconductor material is silicon germanium (SiGe). Other materials suitable for the first semiconductor layer 310 and the second semiconductor layer 318 are within the contemplated scope of the disclosure. In some embodiments, the stack 41 has a plurality of the first semiconductor layers 310 and a plurality of the second semiconductor layers 318. The numbers of the first and second semiconductor layers 310, 318 in the stack 41 are determined according to application requirements. In FIG. 2A, the stack 41 has three first semiconductor layers 310 and three second semiconductor layers 318. The first and second semiconductor layers 310, 318 may have the same thickness or different thicknesses in the Z direction. In FIG. 2A, the thickness of the first semiconductor layer 310 is substantially the same as the thickness of the second semiconductor layer 318.

In some embodiments, the substrate 40 may be, for example, but not limited to, a silicon-on-insulator (SOI) substrate, a germanium-on-insulator (GOI) substrate, a bulk semiconductor substrate, or the like. The substrate 40 may have multiple layers. The substrate 40 may include, for example, elemental semiconductor materials, such as crystalline silicon, diamond, or germanium; compound semiconductor materials, such as silicon carbide, gallium arsenic, indium arsenide, gallium phosphide, indium arsenide, indium phosphide, or indium antimonide; alloy semiconductor materials, such as silicon germanium, silicon germanium carbide, gallium arsenic phosphide, aluminum gallium arsenide, or gallium indium phosphide; or combinations thereof. The substrate 40 may be intrinsic or doped with a dopant or different dopants. Other materials suitable for the substrate 40 are within the contemplated scope of the disclosure. In some embodiments, the substrate 40 is a bulk silicon substrate.

Each of the first semiconductor layers 310 and the second semiconductor layers 318 in the stack 41 may be formed on the substrate 40 by a suitable fabrication technique, for example, chemical vapor deposition (CVD), metalorganic CVD (MOCVD), plasma-enhanced CVD (PECVD), molecular-beam epitaxy (MBE), vapor-phase epitaxy (VPE), low-pressure CVD (LPCVD), ultra-high vacuum CVD (UHV-CVD), physical vapor deposition (PVD), atomic layer deposition (ALD), remote plasma atomic layer deposition (RPALD), plasma-enhanced atomic layer deposition (PEALD), molecular-beam deposition (MBD), or the like, or combinations thereof. Other suitable techniques for forming the first semiconductor layers 310 and the second semiconductor layers 318 are within the contemplated scope of the disclosure.

In some embodiments, the stack 41 further has a mask layer 45 disposed on the uppermost one of the first semiconductor layers 310 (as shown in FIG. 2A). The mask layer 45 may include, for example, but not limited to, a dielectric material, such as a nitride (e.g., SiN), an oxide (e.g., $SiO_x$), or the like, or combinations thereof. Other materials suitable for the mask layer 45 are within the contemplated scope of the disclosure. The mask layer 45 may have multiple sub-layers. In certain embodiments, the mask layer 45 is a patterned mask layer.

In FIG. 2B, the stack 41 and the substrate 40 are patterned to form the first layered element 400 and the second layered element 401 by removing portions of the stack 41 and the substrate 40. After performing patterning in step 101, trenches 42 are formed to separate the first and second layered elements 400, 401. Each of the first layered element 400 and the second layered element 401 includes a stack segment 410 formed from patterning of the stack 41, a substrate segment 411 formed from patterning of the substrate 40, and a residual substrate segment 412. In certain embodiments, the stack segment 410 includes a nanosheet stack 414 which includes at least one first nanosheet 311 and at least one second nanosheet 312 alternating with the at least one first nanosheet 311. In some embodiments, the nanosheet stack 414 includes a plurality of the first nanosheets 311 and a plurality of the second nanosheets 312. The first nanosheets 311 are formed from patterning of the first semiconductor layers 310 in the stack 41, and the second nanosheets 312 are formed from patterning of the second semiconductor layers 318 in the stack 41. In some embodiments, the stack segment 410 further includes a mask segment 413 which is formed on the nanosheet stack 414 and which is formed from patterning the mask layer 45 in the stack 41. In certain embodiments, the first layered element 400 and the second layered element 401 are fin structures. The patterning of the stack 41 and the substrate 40 may be performed using any suitable etching process, for example, but not limited to, dry etching, wet etching, reactive ion etching (RIE), or the like, or combinations thereof. The etching process may be an anisotropic etching process. In some embodiments, the etching process may use an etch gas such as a nitrogen-containing etch gas (e.g., $NH_3$), a halogen-containing etch gas (for example, a chlorine-containing etch gas such as $Cl_2$, $SiCl_4$, $BCl_3$, $CHCl_3$, $CCl_4$, or the like, a fluorine-containing etch gas such as $F_2$, $NF_3$, $C_xF_y$, $CH_xF_y$, HF, $SF_6$, or the like), a hydrogen-containing etch gas (e.g., $H_2$), or the like, or combinations thereof, but not limited thereto. The etching process may use a carrier gas to deliver the etch gas. The etching process may use a solution containing a wet etchant (i.e., a wet etchant solution). The wet etchant solution may include $NH_4OH$, $H_2SO_4$, $H_2O_2$, HCl, $H_2O$, HF, $HNO_3$, diluted HF, $O_3$, $H_3PO_4$, or the like, or combinations thereof. In certain embodiments, the etching process may be a timed process so that etching is stopped after a period of time when desired portions of the stack 41 and/or the substrate 40 is removed. Before the etching process, a photoresist may be developed using a lithography process which may include the following sub-steps: (i) forming a photoresist (not shown) to cover the stack 41, and (ii) patterning the photoresist such that the photoresist forms into a patterned photoresist. The photoresist may be formed by spin coating. Patterning of the photoresist may be performed using a photomask or without a mask (e.g., ion-beam writing). The etching process uses the patterned photoresist as an etch mask to pattern the stack 41 and the substrate 40. After the etching process, the patterned photoresist is removed by, for example, a stripping process. Other suitable processes for removing the patterned photoresist are within the contemplated scope of the disclosure. Patterning of the stack 41 and the substrate 40 may include multiple etching processes so that the first layered element 400 and the second layered element 401 are formed according to application requirements. Other suitable processes for patterning the stack 41 and the substrate 40 are within the contemplated scope of the disclosure.

In some embodiments, a dielectric liner (not shown) may be formed over the structure shown in FIG. 2B using CVD, PVD, ALD, or other suitable processes to enhance the performance of the device 200A obtained using the method 100. The dielectric liner includes silicon oxide, silicon nitride, or a combination thereof. Other suitable processes and materials for forming the dielectric liner are within the contemplated scope of the disclosure.

Figure 3:
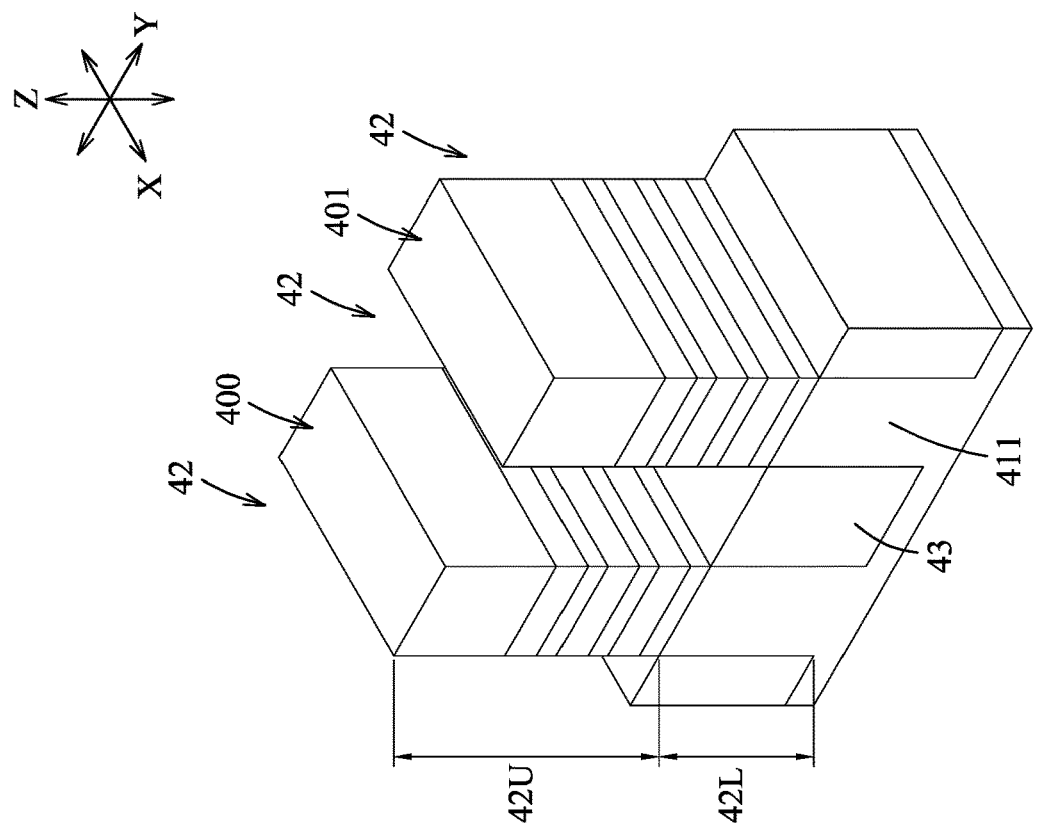

Referring to FIG. 1A and the example illustrated in FIG. 3, the method 100 proceeds to step 102, where trench isolation elements 43 are formed to fill lower portions 42L of the trenches 42, respectively. To form the trench isolation elements 43, first, a first isolation material is filled in the trenches 42 by, for example, a deposition process, such as CVD, PECVD, FCVD (flowable CVD), or other suitable techniques. Thereafter, the first isolation material is planarized to remove an excess thereof such that the first isolation material is flush with upper surfaces of the first and second layered elements 400, 401. Then, the first isolation material is etched back to obtain the trench isolation elements 43. The planarization process may be a chemical-mechanical planarization (CMP) process, other suitable techniques, or combinations thereof. Thereafter, the first isolation material is etched back to form the trench isolation elements 43 in the trenches 42 using, for example, a dry etching process, but is not limited thereto. In FIG. 3, upper surfaces of the trench isolation elements 43 are located at substantially the same level as the upper surfaces of the substrate segments 411 of the first and second layered elements 400, 401. The trench isolation elements 43 may serve as shallow trench isolations (STI) to alternate with the first and second layered elements 400, 401. The trench isolation elements 43 may include an oxide material, such as silicon oxide, but not limited thereto. Other materials and processes suitable for forming the trench isolation elements 43 are within the contemplated scope of the disclosure.

Figure 4:
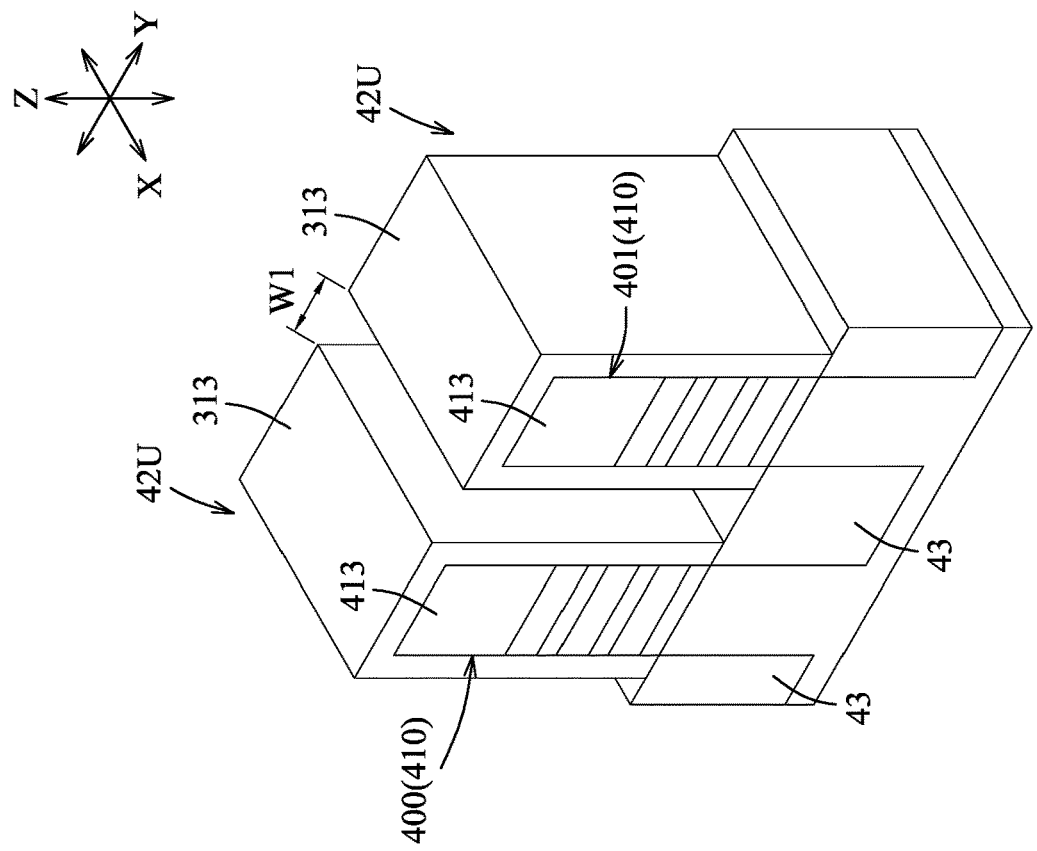

Referring to FIG. 1A and the example illustrated in FIG. 4, the method 100 proceeds to step 103, where third semiconductor layers 313 are formed on the trench isolation elements 43 to respectively wrap the stack segments 410 of the first and second layered elements 400, 401. In FIG. 4, the third semiconductor layers 313 are partially located in upper portions 42U of the trenches 42 and are spaced apart from each other. In some embodiments, after step 103, the remaining segment of the upper portion 42U of each of the trenches 42 may have a width (W1) along the Y direction which ranges from about 20 nm to about 40 nm.

The third semiconductor layers 313 may be formed by suitable fabrication techniques such as CVD, ALD, PVD, PECVD, or the like, or combinations thereof, and may include, for example, but not limited to, silicon germanium, or the like. Other suitable techniques and materials for forming the third semiconductor layers 313 are within the contemplated scope of the disclosure. In some embodiments, the third semiconductor layers 313 may be made of the same material as that of the second semiconductor layers 318.

Figure 5:
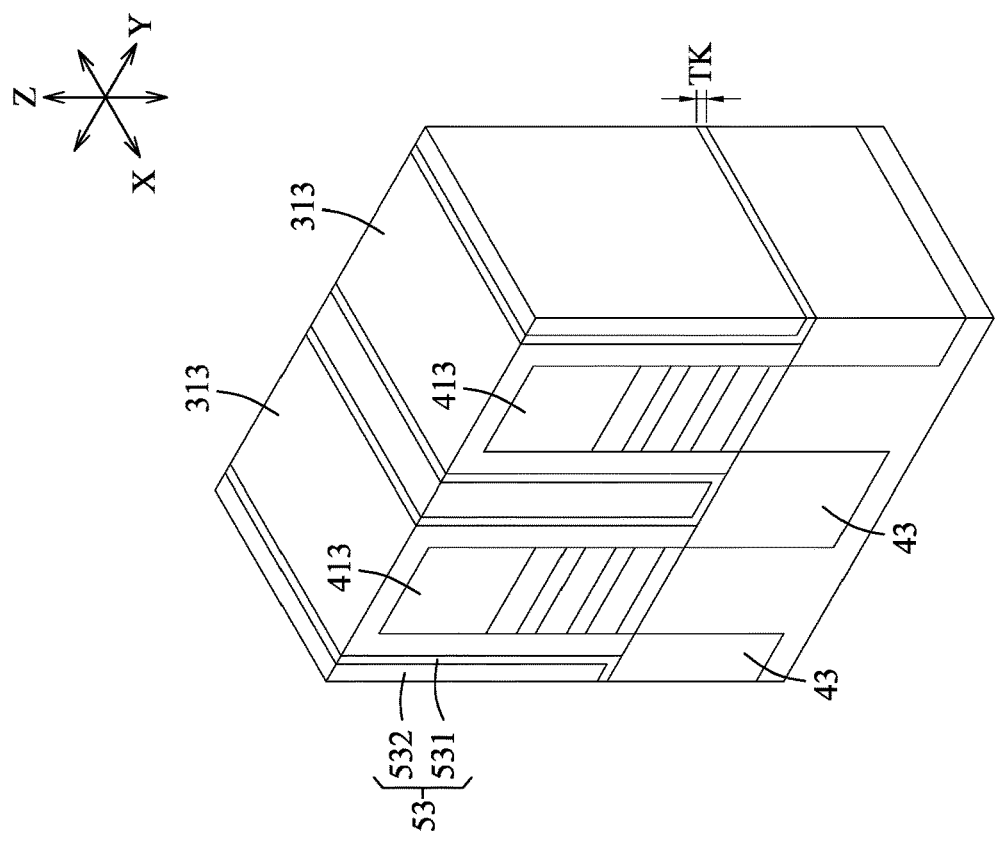

Referring to FIG. 1A and the examples illustrated in FIGS. 4 and 5, the method 100 proceeds to step 104, where first dielectric elements 53 are filled respectively in the remaining segments of the upper portions 42U of the trenches 42.

In some embodiments, each of the first dielectric elements 53 may include a first dielectric film 531 and a first dielectric body 532. The first dielectric film 531 is formed between the first dielectric body 532 and the third semiconductor layers 313 (as shown in FIG. 5). In certain embodiments, the first dielectric film 531 and the first dielectric body 532 are made of different materials. In some embodiments, step 104 may include the following sub-steps: (i) conformally depositing a first dielectric layer, which is for forming the first dielectric film 531, on the third semiconductor layers 313 and on the trench isolation elements 43 exposed from the remaining segments of the upper portions 42U of the trenches 42, (ii) forming a second dielectric layer, which is for forming the first dielectric body 532, on the first dielectric layer until the remaining segments of the upper portions 42U of the trenches 42 are filled, and (iii) removing an excess of the first dielectric layer and the second dielectric layer to expose the third semiconductor layers 313, to thereby form the first dielectric elements 53. The first dielectric film 531 may have a thickness (TK) ranging from about 2 nm to about 6 nm. The first dielectric layer may be formed using suitable fabrication techniques such as ALD, CVD, PVD, HDPCVD, MOCVD, RPCVD, PECVD, APCVD, SAVCD, or the like, or combinations thereof. The second dielectric layer may be formed using suitable fabrication techniques such as LPCVD, FCVD, HPCVD, HARP, CVD, or the like, or combinations thereof. Removal of the excess of the first and second dielectric layers may be performed using a planarization process, such as CMP, or the like. Other suitable techniques for forming the first dielectric elements 53 are within the contemplated scope of the disclosure.

The first dielectric film 531 includes a low-k dielectric material (i.e., a dielectric material having a dielectric constant (k) of not greater than about 7). In certain embodiments, the first dielectric film 531 may include, for example, a silicon-based dielectric material such as silicon oxide, silicon nitride, silicon oxycarbide, or the like, but not limited thereto. The first dielectric film 531 may be intrinsic or doped with a p-type dopant and/or an n-type dopant. The first dielectric body 532 may include an oxide material such as silicon oxide, or the like, but not limited thereto. The oxide material of the first dielectric body 532 may be the same as the oxide material of the trench isolation elements 43.

Figure 6:
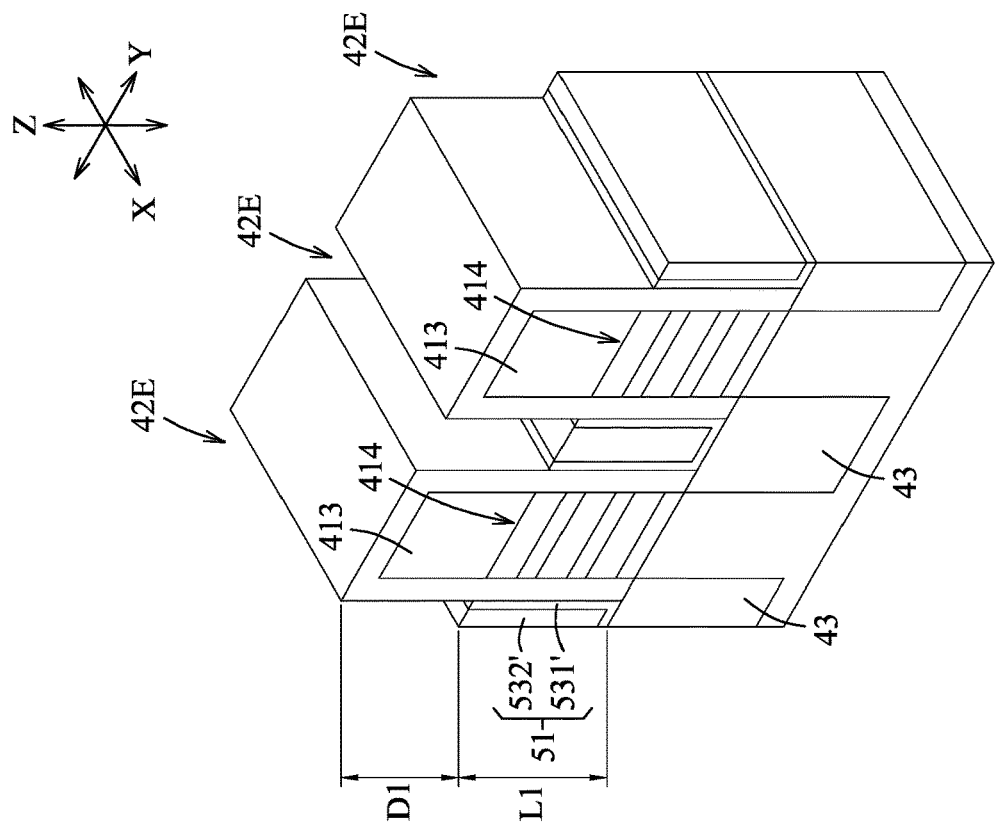

Referring to FIG. 1A and the examples illustrated in FIGS. 5 and 6, the method 100 proceeds to step 105, where the first dielectric elements 53 are partially removed to form isolation bodies 51. After step 105, etching recesses 42E are formed, a remaining part of the first dielectric film is denoted by the numeral 531', and a remaining part of the first dielectric body is denoted by the numeral 532'.

In some embodiments, after step 105, upper surfaces of the isolation bodies 51 are at a level substantially the same as upper surfaces of the nanosheet stacks 414 with respect to upper surfaces of the trench isolation elements 43. In some embodiments, step 105 is performed by an etching process, for example, but not limited to, dry etching, wet etching, other suitable techniques, or combinations thereof. The etching process selectively removes the first dielectric elements 53 with respect to the third semiconductor layers 313. That is, the etching process implements an etchant that has a high etch selectivity for dielectric materials (i.e., the first dielectric elements 53) compared to semiconductor materials (i.e., the third semiconductor layers 313) so that the third semiconductor layers 313 are not or are not substantially removed during step 105. In some embodiments, the etching process may be similar to those described in step 101, but parameter(s) of the etching process (e.g., concentration(s) of etchant(s), flow rate(s) of etchant(s), concentration ratio of etchant(s), bias voltage, a power of a radio frequency source, process pressure, process temperature, wafer temperature, etchant temperature) is tunable to achieve selective removal of the first dielectric elements 53.

In some embodiments, after step 105, the etching recesses 42E each has a depth (D1) along the Z direction which ranges from about 25 nm to about 35 nm. Each of the isolation bodies 51 has a length (L1) along the Z direction that ranges from about 50 nm to about 70 nm.

Figure 7:
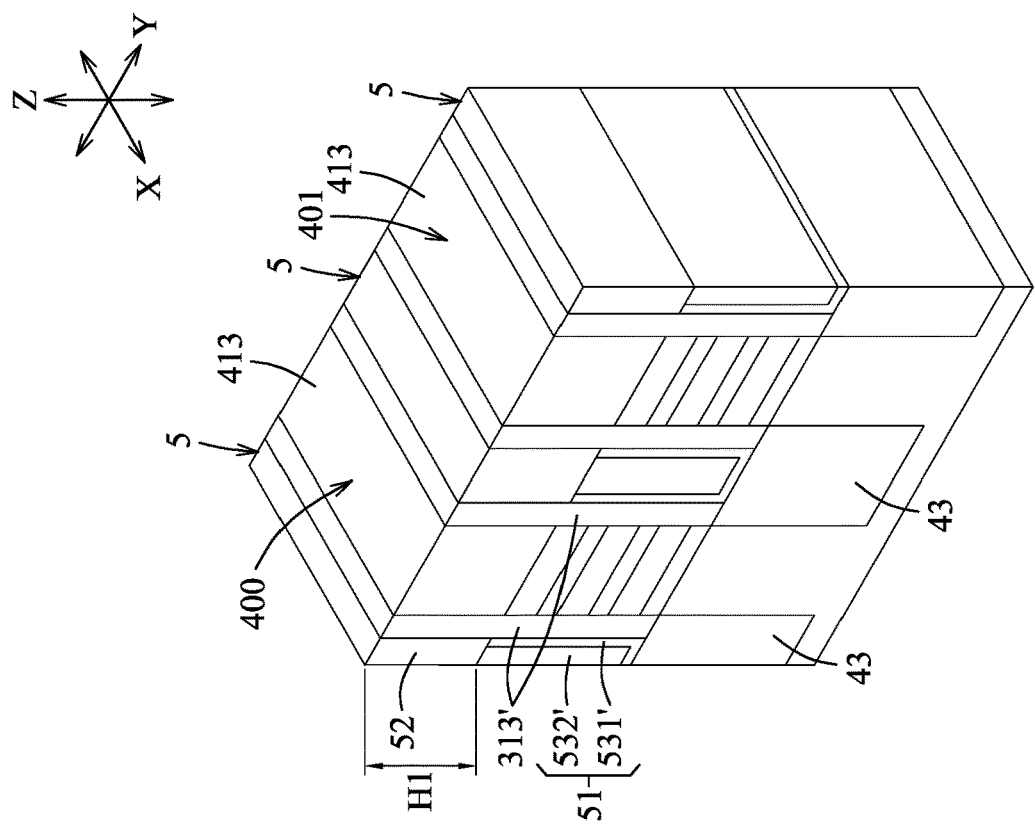

Referring to FIG. 1A and the examples illustrated in FIGS. 6 and 7, the method 100 proceeds to step 106, where isolation features 52 are formed on the isolation bodies 51 to respectively refill the etching recesses 42E, thereby obtaining isolation structures 5 each including one of the isolation features 52 and a corresponding one of the isolation bodies 51. As shown in FIG. 7, one of the isolation features 5 is disposed between and separates the first and second layered elements 400, 401. The isolation features 52 have a dielectric constant greater than about 8 and less than about 16. In some embodiments, the isolation features 52 have a dielectric constant greater than about 7 and less than about 15. In certain embodiments, the isolation features 52 include a rare-earth element (i.e., a rare-earth element-containing dielectric material). In some other embodiments, the isolation features 52 includes a rare-earth oxide ($REO_x$) and have a dielectric constant greater than about 8.5 and less than about 15.

In some embodiments, step 106 may include the follow sub-steps: (i) depositing a third dielectric layer, which is for forming the isolation features 52, on the third semiconductor layers 313 and the isolation bodies 51 to refill the etching recesses 42E, and (ii) removing portions of the third semiconductor layers 313 and a portion of the third dielectric layer to expose the first and second layered elements 400, 401. The remaining portion of the third dielectric layer forms the isolation features 52. The third dielectric layer may be formed by suitable fabrication techniques, such as ALD, PVD, CVD, FCVD, or other suitable techniques, but not limited thereto. In some embodiments, the third dielectric layer is formed by PVD. A precursor ($RE(iPrCp)_3$, where RE stands for a rare-earth element) reacts with a reactant, such as $C_3$ or $H_2O$, to yield a rare-earth (RE) target or a rare-earth oxide ($REO_x$) target for PVD of the third dielectric layer. The precursor reacts with the reactant at a temperature ranging from about 200° C. to about 400° C. A rare-earth element refers typically to scandium (Sc), yttrium (Y), and lanthanides (lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu)). In certain embodiments, the rare-earth element is chosen according to material cost and a dielectric constant of the rare-earth oxide formed from the rare-earth element. In some embodiments, the RE target is used as a deposition source and undergoes an oxygen plasma treatment for PVD of the third dielectric layer. In some other embodiments, the $REO_x$ target is used as the deposition source for PVD of the third dielectric layer. In certain embodiments, the PVD process is performed at a temperature ranging from about room temperature (i.e., about 20° C.) to about 400° C. The third dielectric layer includes $REO_x$ that has a dielectric constant of less than 15 and greater than a dielectric constant of the isolation bodies 51. In some embodiments, the third dielectric layer (i.e., the isolation features 52) includes $TbO_x$, $CeO_x$, $YO_x$, $EuO_x$, $GdO_x$, $DyO_x$, $HoO_x$, $ErO_x$, $LuO_x$, $YbO_x$, other suitable materials, or combinations thereof.

Removal of the portions of the third semiconductor layers 313 and the portion of the third dielectric layer may be performed using a planarization process, for example, CMP, or other suitable processes, or combinations thereof to permit an upper surface of the planarized third dielectric layer to be flush with an upper surface of the planarized third semiconductor layers 313 (as shown in FIGS. 6 and 7). In some embodiments, as shown in FIG. 7, after the planarization process, an upper surface of the mask segment 413 of each of the first and second layered elements 400, 401 is exposed. Other suitable planarization processes for forming the isolation features 52 are within the contemplated scope of the disclosure. After step 106, the third dielectric layer forms into the isolation features 52, and each of the third semiconductor layers 313 forms into two sacrificial segments 313' that are disposed on two opposite sides of a corresponding one of the first and second layered elements 400, 401. In certain embodiments, upper surfaces of the isolation features 52 are flush with the upper surfaces of the mask segments 413 of the first and second layered elements 400, 401. The isolation features 52 may have a height (H1) measured along the Z direction that ranges from about 25 nm to about 45 nm.

Figure 8:
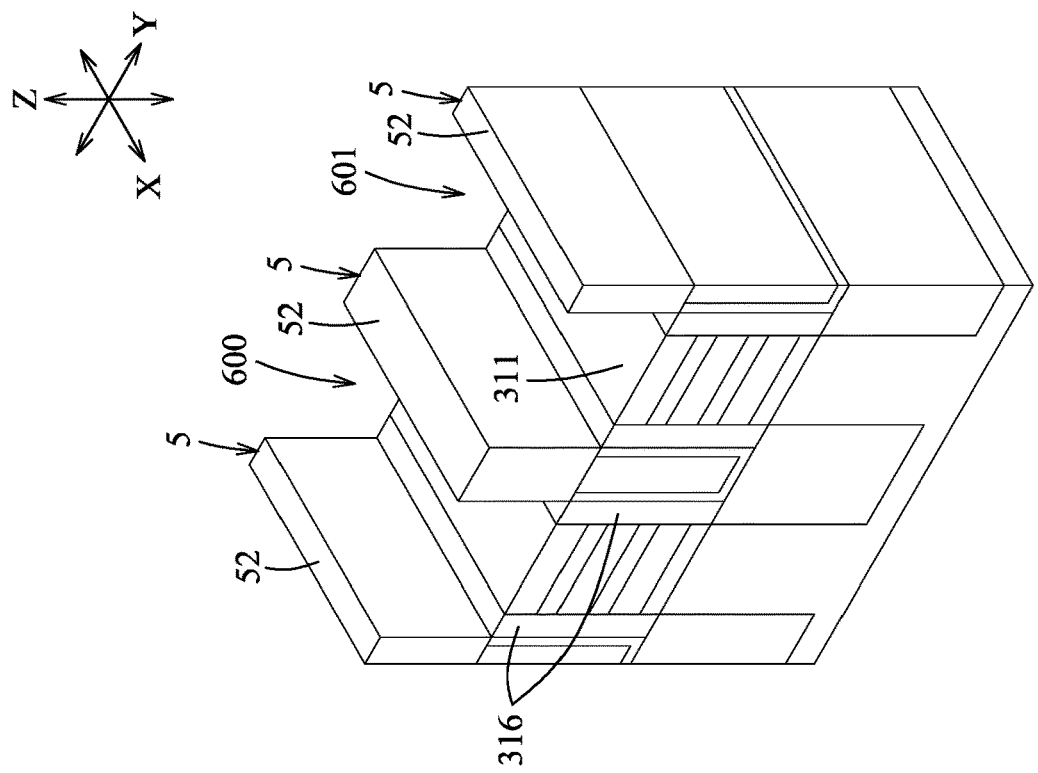

Referring to FIG. 1A and the examples illustrated in FIGS. 7 and 8, the method 100 proceeds to step 107, where the mask segments 413 of the first and second layered elements 400, 401 are removed to leave first and second semiconductor structures 600, 601 respectively in the first and second layered elements 400, 401. In addition, in step 107, upper parts of the sacrificial segments 313' are removed to form sacrificial portions 316 disposed on opposite sides of the first and second semiconductor structures 600, 601. In some embodiments, each of the first and second semiconductor structures 600, 601 is a nanosheet structure. In FIG. 8, after step 107, an uppermost one of the first nanosheets 311 in each of the first and second semiconductor structures 600, 601 is exposed. In addition, upper surfaces of the sacrificial portions 316 are at a level substantially the same as upper surfaces of the first and second semiconductor structures 600, 601 and thus, side surfaces of the isolation features 52 are exposed after step 107.

In some embodiments, step 107 may be performed by an etching process, for example, but not limited to, dry etching, wet etching, other suitable processes or combinations thereof. The etching process selectively removes the mask segments 413 and the part of the sacrificial segments 313' with respect to the first nanosheets 311 and the isolation structures 5. That is, for example, the etching process implements an etchant that has a high etch selectivity for, silicon nitride (i.e., the mask segments 413) and silicon germanium (i.e., the sacrificial segments 313') compared to dielectric materials (i.e., the isolation features 52 of the isolation structures 5) and semiconductor materials (i.e., the first nanosheets 311) so that the first nanosheets 311 and the isolation structures 5 are not substantially removed during removal of the mask segments 413. In some embodiments, the etching process may be similar to those described in step 101, but parameter(s) of the etching process (e.g., concentration(s) of etchant(s), flow rate(s) of etchant(s), concentration ratio of etchant(s), bias voltage, a power of a radio frequency source, process pressure, process temperature, wafer temperature, etchant temperature) is tunable to achieve selective removal of the mask segments 413 and the upper parts of the sacrificial segments 313'. In certain embodiments, the etching process may include multiple steps so that the mask segments 413 and the upper parts of the sacrificial segments 313' are removed separately.

Figure 9B:
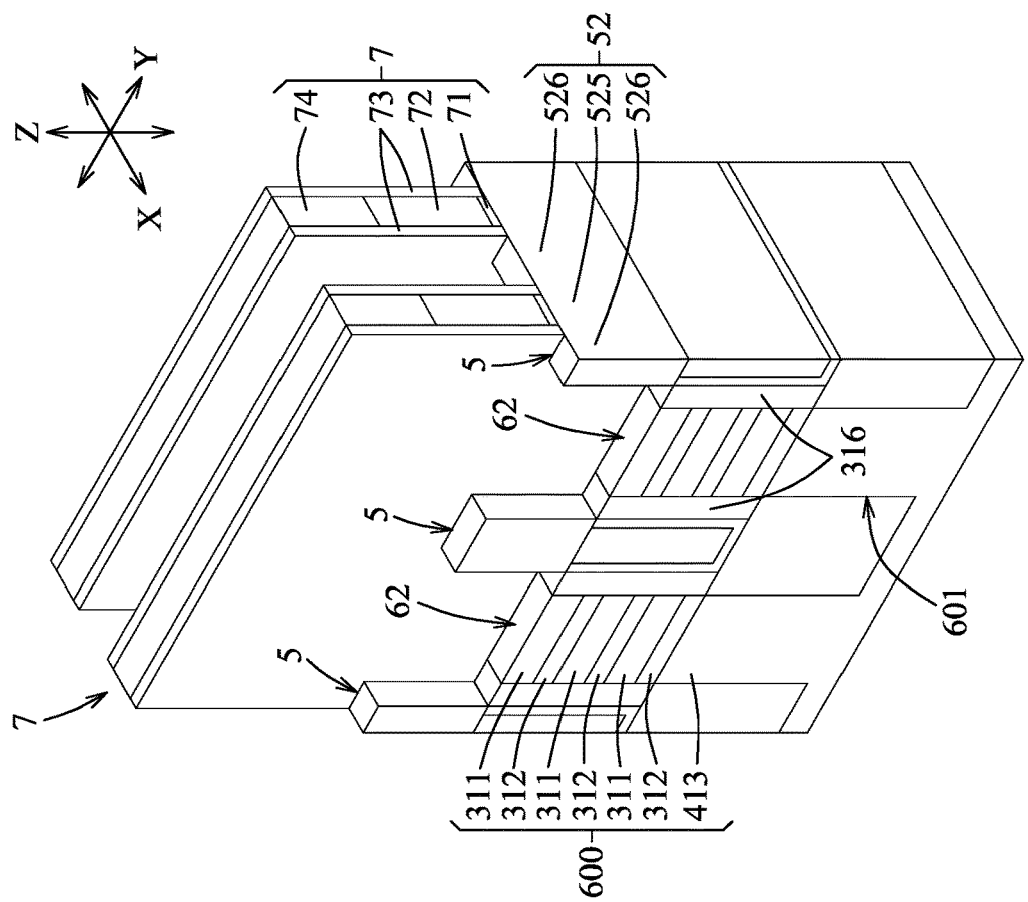
Figure 9A:
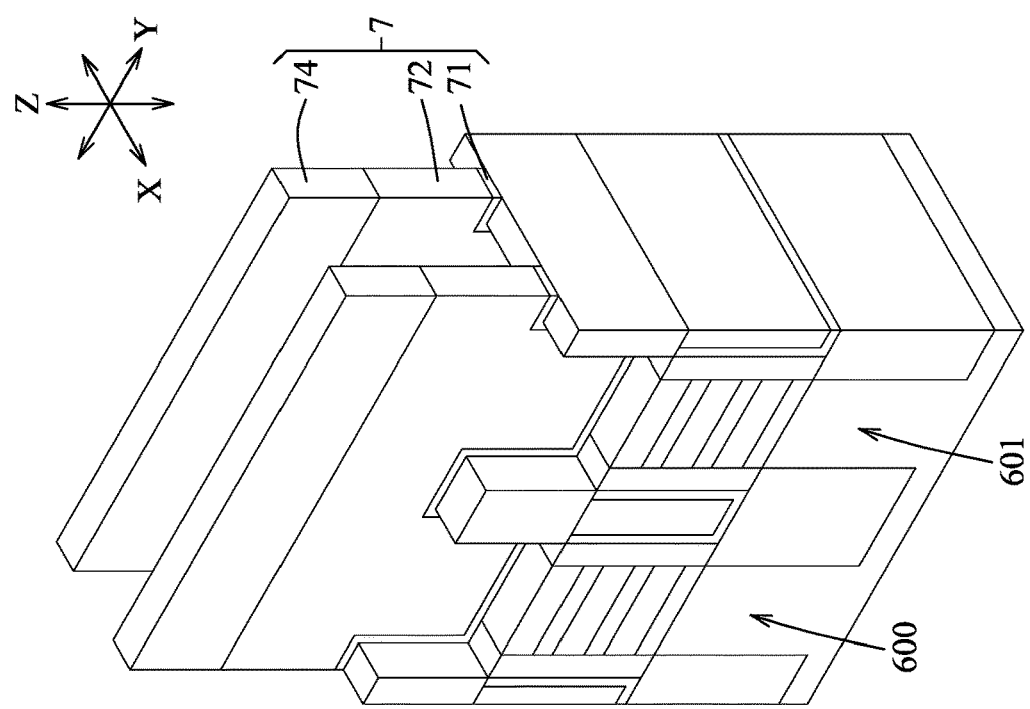

Referring to FIG. 1A and the examples illustrated in FIGS. 9A and 9B, the method 100 proceeds to step 108, where gate structures 7, which are spaced apart in the X direction, are formed over the isolation structures 5 and the first and second semiconductor structures 600, 601 such that each of the first and second semiconductor structures 600, 601 has two exposed portions 62 (i.e., portions not covered by the gate structures 7) at two opposite sides of each of the gate structures 7. In addition, each of the isolation features 52 has an isolation element 525 disposed beneath each of the gate structures 7, and two lateral elements 526 which are respectively positioned at two opposite sides of the isolation element 525, and which are exposed from the gate structures 7. Each of the gate structures 7 includes a dummy dielectric 71 disposed in contact with the isolation structure 5 and the first and second semiconductor structures 600, 601, a dummy gate 72 disposed on the dummy dielectric 71, and two gate spacers 73 (shown in FIG. 9B) disposed at two opposite sides of a dummy stack of the dummy gate 72 and the dummy dielectric 71. Each of the gate structures 7 extends in a direction different from that of each of the first and second semiconductor structures 600, 601. In FIGS. 9A and 9B, each of the gate structures 7 extends in the Y direction orthogonal to a direction where each of the first and second semiconductor structures 600, 601 extends (i.e., the X direction). In some embodiment, the dummy stack further includes a hard mask 74 disposed on the dummy gate 72.

To form the dummy stack, step 108 may include the following sub-steps: (i) conformally and sequentially forming a dummy dielectric layer, a dummy gate layer and a hard mask layer on the structure shown in FIG. 8, and (ii) patterning the hard mask layer, the dummy gate layer, and the dummy dielectric layer. The dummy dielectric layer, the dummy gate layer and the hard mask layer may be formed using a deposition process, for example, but not limited to, ALD, CVD, PVD, MOCVD, RPCVD, LPCVD PECVD, other suitable techniques, or combinations thereof. The dummy dielectric layer may include a dielectric material, such as silicon oxide, but not limited thereto. The dummy gate layer may include polycrystalline silicon, microcrystal silicon, amorphous silicon, or the like, but not limited thereto. The hard mask layer may include silicon nitride, silicon oxide, silicon oxynitride, or combinations thereof, but not limited thereto. Each of the dummy dielectric layer, the dummy gate layer, and the hard mask layer may include sub-layers. The dummy dielectric layer, the dummy gate layer, and the hard mask layer may be patterned using an etching process, such as a dry etching process, a wet etching process, or the like, or combinations thereof. Before the etching process, a lithography process may be used to develop a resist layer on the hard mask layer. Other materials and processes suitable for forming the dummy stack are within the contemplated scope of the present disclosure.

To form the two gate spacers 73, step 108 may further include the following sub-steps: (iii) forming a gate spacer layer that is disposed to cover the structure shown in FIG. 9A, and (iv) removing portions of the gate spacer layer to form the gate spacers 73 disposed to sandwich the dummy stack. The gate spacers 73 may include, for example, but not limited to, a silicon carbon-containing dielectric material, a silicon oxide-containing material, other suitable materials, silicon nitride, other suitable materials, or combinations thereof. The gate spacer layer may be formed using a deposition process, for example, CVD, PVD, PECVD, or the like, or combinations thereof. The portions of the gate spacer layer may be removed using an etching process. The etching process may be an anisotropic etching process such as dry etching, but not limited thereto, and is performed so that remaining portions of the gate spacer layer form into the gate spacers 73 disposed on two opposite sides of the dummy stack. In some embodiments, the gate spacer layer includes sub-layers, and thus, the gate spacers 73 has a layered structure (not shown). The gate structure 7 may have a width in the X direction that gradually enlarges along the Z direction (i.e., from an upper surface of the gate structure 7). Other processes and materials suitable for forming the gate spacers 73 are within the contemplated scope of the present disclosure.

Figure 10B:
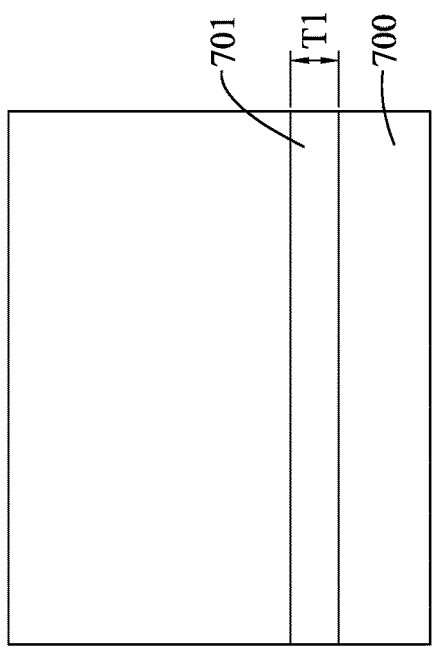
FIGS. 10B to 10F are schematic views illustrating simulation of layers of hafnium-based dielectric material and layers of rare-earth element-containing dielectric material in accordance with some embodiments of the present disclosure.
Figure 10A:
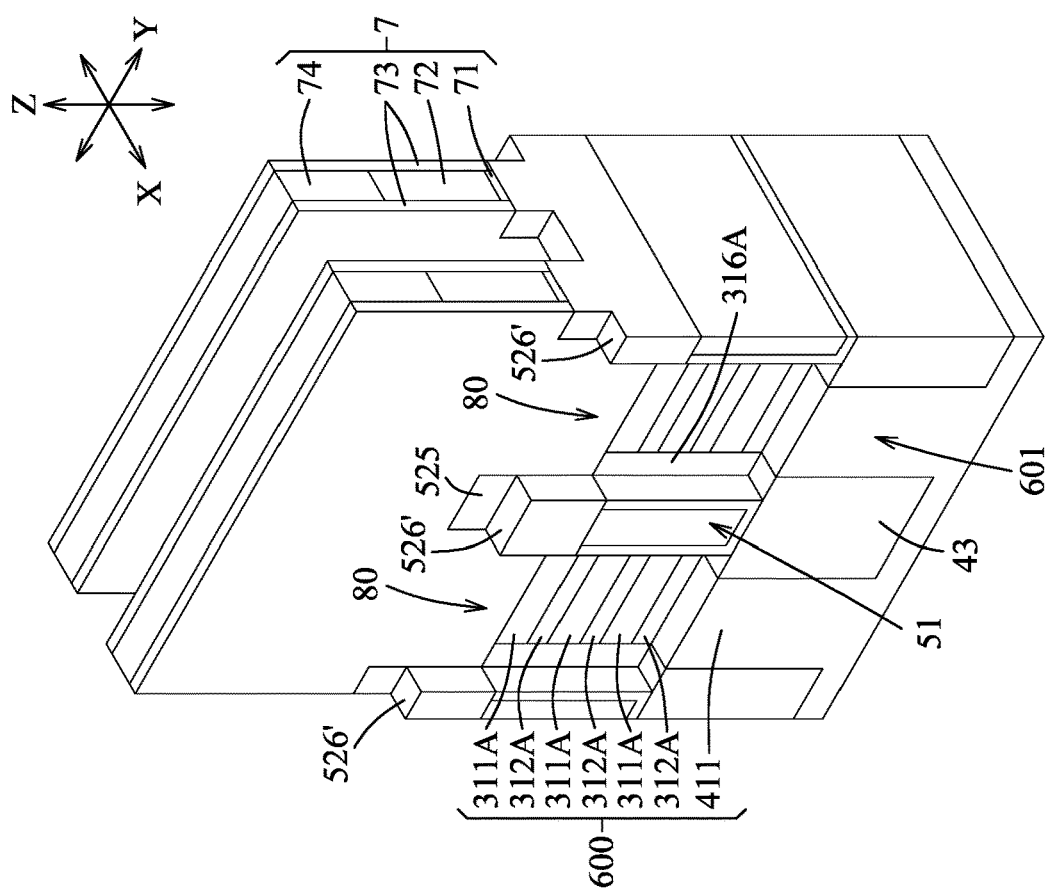

Referring to FIG. 1A and the examples illustrated in FIGS. 9B and 10A, the method 100 proceeds to step 109, where two source/drain recesses 80 are formed respectively in the exposed portions 62 of each of the first and second semiconductor structures 600, 601. Step 109 may include the following sub-steps: (i) removing parts of the first and second semiconductor structures 600, 601 from the exposed portions 62 so that the first nanosheets 311 are formed into first nanosheet segments 311A and the second nanosheets 312 are formed into second nanosheet segments 312A, and (ii) removing lateral parts of the sacrificial portions 316 not covered by the gate structures 7 so as to leave sacrificial bodies 316A. The source/drain recesses 80 are each defined by side surfaces of two adjacent ones of the isolation bodies 51, side surfaces of the sacrificial bodies 316A disposed under a corresponding one of the gate structures 7, and side surfaces of the first and second nanosheet segments 311A, 312A of a corresponding one of the first and second semiconductor structures 600, 601

The source/drain recesses 80 may be formed using an etching process, for example, a reactive-ion etching (RIE) process, but not limited thereto. The RIE process implements halogen ions (e.g., fluorine ions) to collide with (i.e., bombard) the exposed portions 62 of the first and second semiconductor structures 600, 601, the part of the sacrificial portions 316 not covered by the gate structures 7, and a portion of the isolation structures 5 not covered by the gate structures 7. During the RIE process, upper parts of the lateral elements 526 are removed (remaining parts of the lateral elements 526 are denoted by the numeral 526'), and a RIE by-product layer (not shown) is formed on the remaining parts 526'. In addition, the exposed portions 62 are removed to expose the trench isolation elements 43. The RIE by-product layer provides protection to the remaining parts 526' against ion bombardment. The RIE by-product layer is formed from halogen ions reacting with a material(s) in the lateral elements 526 of the isolation features 52 during collision. Therefore, the RIE by-product layer may include $REX_j$, where RE refers to a rare-earth element in the isolation features 52, X refers to the halogen element used for bombarding the isolation features 52, and j is a positive number. The RIE by-product layer including a rare-earth element typically has a boiling point (greater than about 1200° C., or greater than about 2200° C.) greater than a boiling point (less than about 1000° C.) of a RIE by-product layer including hafnium (Hf), which has improved ability to withstand high-energy bombardment (i.e., ion bombardment), and thus offers enhanced protection to the isolation bodies 51. Subsequently, the RIE by-product layer is removed using a clean process such as a wet clean process. Since the rare-earth element-containing dielectric material in the remaining parts 526' has high hydrophobicity (large contact angle), the remaining parts 526' are less likely to be damaged during the clean process. Other processes suitable for forming the source/drain recesses 80 are within the contemplated scope of the present disclosure.

Figure 10C:
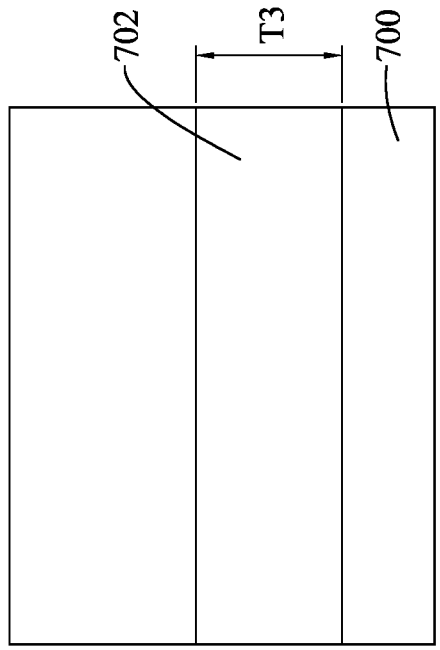
Figure 10D:
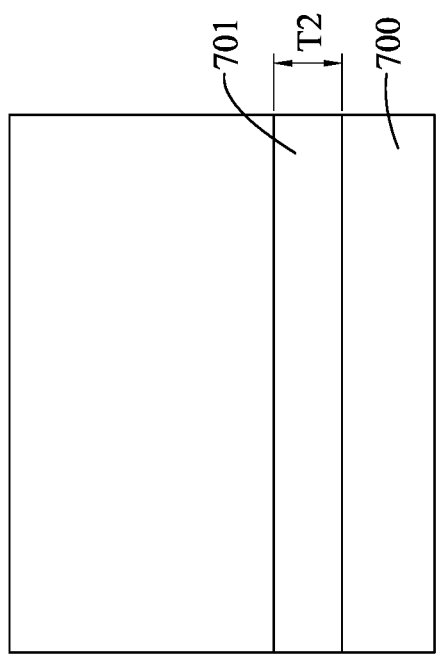
Figure 10E:
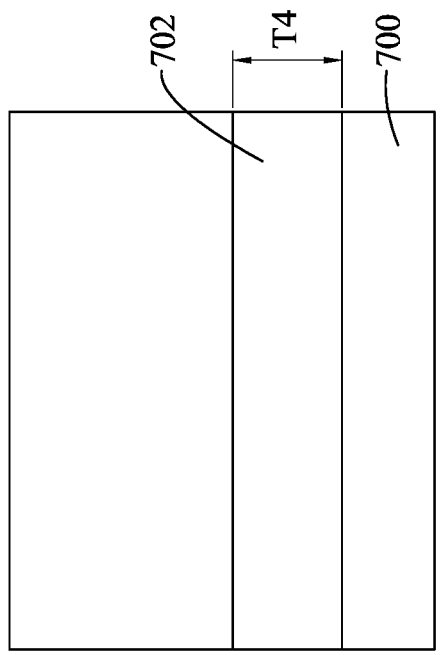
Figure 10F:
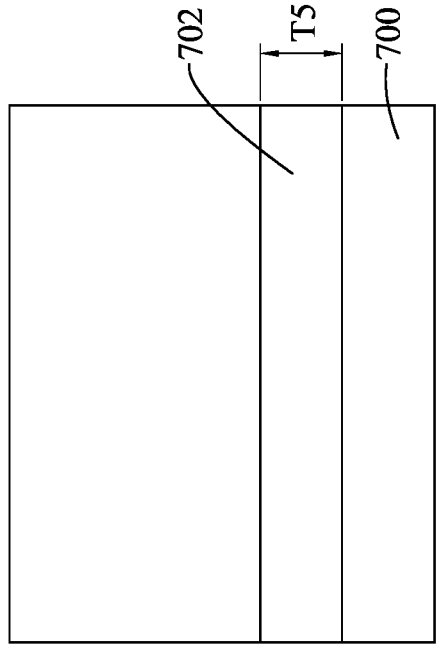

Referring to FIGS. 10B to 10F, schematic views of layers 701 of hafnium-based dielectric material ($HfO_x$) and layers 702 of rare-earth element-containing dielectric material ($TbO_x$) are provided for simulation damages of the isolation features 52 during step 109 in accordance with some embodiments. The layers 701, 702 are each previously formed on a semiconductor layer 700 (for example, but not limited to, a silicon layer), and then are subjected to ion bombardments described in the following. FIG. 10B is a schematic view of a layer 701 of hafnium-based dielectric material (HfO$_x$) after fluorine ion bombardment. FIG. 10C is a schematic view of the layer 701 of hafnium-based dielectric material after bromine ion bombardment. FIG. 10D is a schematic view of a layer 702 of rare-earth element-containing dielectric material (TbO$_x$) before ion bombardment. FIG. 10E is a schematic view of the layer 702 of rare-earth element-containing dielectric material after fluorine ion bombardment. FIG. 10F is a schematic view of the layer 702 of rare-earth element-containing dielectric material after bromine ion bombardment. The layer of hafnium-based dielectric material before ion bombardment has a thickness ranging from about 123 Å to about 133 Å. After fluorine ion bombardment, the layer 701 of hafnium-based dielectric material shown in FIG. 10B has a thickness (T1) ranging from about 25 Å to about 35 Å. After bromine ion bombardment, the layer 701 of hafnium-based dielectric material shown in FIG. 10C has a thickness (T2) ranging from about 31 Å to about 41 Å. The layer 702 of rare-earth element-containing dielectric material before ion bombardment (see FIG. 10D) has a thickness (T3) ranging from about 92 Å to about 102 Å. After fluorine ion bombardment, the layer 702 of rare-earth element-containing dielectric material shown in FIG. 10E has a thickness (T4) ranging from about 74 Å to about 84 Å. After bromine ion bombardment, the layer 702 of rare-earth element-containing dielectric material shown in FIG. 10F has a thickness (T5) ranging from about 43 Å to about 50 Å. The fluorine and bromine ion bombardments are performed using the same parameters and same conditions. Therefore, these results show that rare-earth element-containing dielectric material (TbO$_x$) has a better resistance (i.e., less loss) against ion bombardment compared with hafnium-based dielectric material (HfO$_x$), and can offer better protection for the isolation bodies 51.

In some embodiments, after removing the RIE by-product layer, the remaining parts 526' are removed (i.e., recessed in the Z direction, see FIGS. 10A and 11), using, for example, an etching process, such as wet etching, dry etching, or the like, or combinations thereof. In some embodiments, the etching process may be similar to those described in step 101, but parameter(s) of the etching process (e.g., concentration(s) of etchant(s), flow rate(s) of etchant(s), concentration ratio of etchant(s), bias voltage, a power of a radio frequency source, process pressure, process temperature, wafer temperature, etchant temperature) is tunable to achieve selective removal of the remaining parts 526'. Other suitable processes for removing the remaining parts 526' are within the contemplated scope of the present disclosure. By removal of the remaining parts 526', a capacitance impact of the device 200A (shown in FIGS. 21A and 21B) can be reduced. In some other embodiments, the remaining parts 526' are removed at any steps after step 109 and before step 113.

Figure 11:
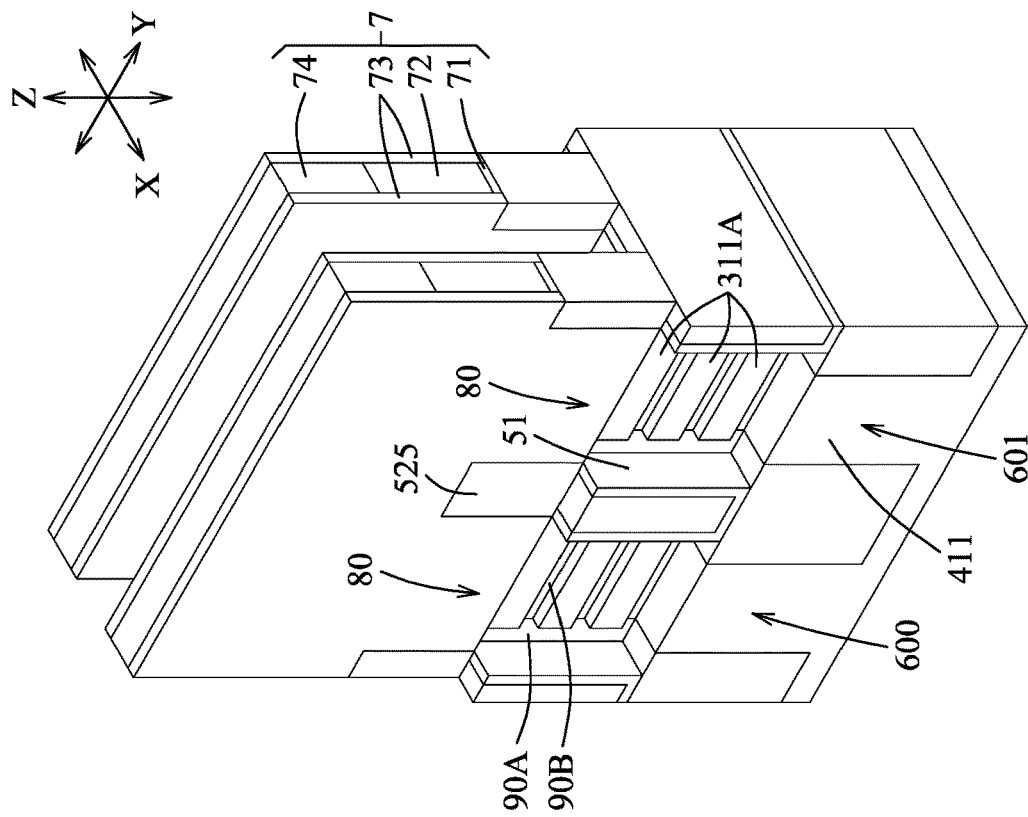

Referring to FIG. 1A and the examples illustrated in FIGS. 10A and 11, the method 100 proceeds to step 110, where end regions of the sacrificial bodies 316A and end regions of the second nanosheet segments 312A are removed so as to form inner gaps 90A and lateral recesses 90B, respectively.

The inner gaps 90A and the lateral recesses 90B are formed under the gate spacers 73 of the gate structures 7, and are each in spatial communication with a corresponding one of the source/drain recesses 80. In some embodiments, each of the inner gaps 90A and the lateral recesses 90B can extend to locate partially under the dummy dielectric 71 of a corresponding one of the gate structures 7. The first nanosheet segments 311A under the gate spacers 73 of the corresponding gate structure 7 are each separated from adjacent ones of the isolation bodies 51 by a corresponding one of the inner gaps 90A. The first nanosheet segments 311A in each of the first and second semiconductor structures 600, 601 are separated from one another by the lateral recesses 90B. A lowermost one of the first nanosheet segments 311A is separated from the substrate segment 411 by a lowermost one of the lateral recesses 90B.

Step 110 may be performed using an etching process such as wet etching, or the like, but not limited thereto. The inner gaps 90A and the lateral recesses 90B may be formed by multiple and/or different etching processes, and may not be spontaneously formed. In some embodiments, the etching process implements an etchant having an etch selectivity for silicon germanium (i.e., the sacrificial portions 316 and the second nanosheets 312) to silicon (i.e., the first nanosheets 311). In some embodiments, the etching process may be similar to those described in step 101, but parameter(s) of the etching process (e.g., concentration(s) of etchant(s), flow rate(s) of etchant(s), concentration ratio of etchant(s), bias voltage, a power of a radio frequency source, process pressure, process temperature, wafer temperature, etchant temperature) is tunable to achieve removal of the end regions of the sacrificial bodies 316A and the end regions of the second nanosheet segments 312A. Other suitable processes for forming the inner gaps 90A and the lateral recesses 90B are within the contemplated scope of the present disclosure.

Figure 12:
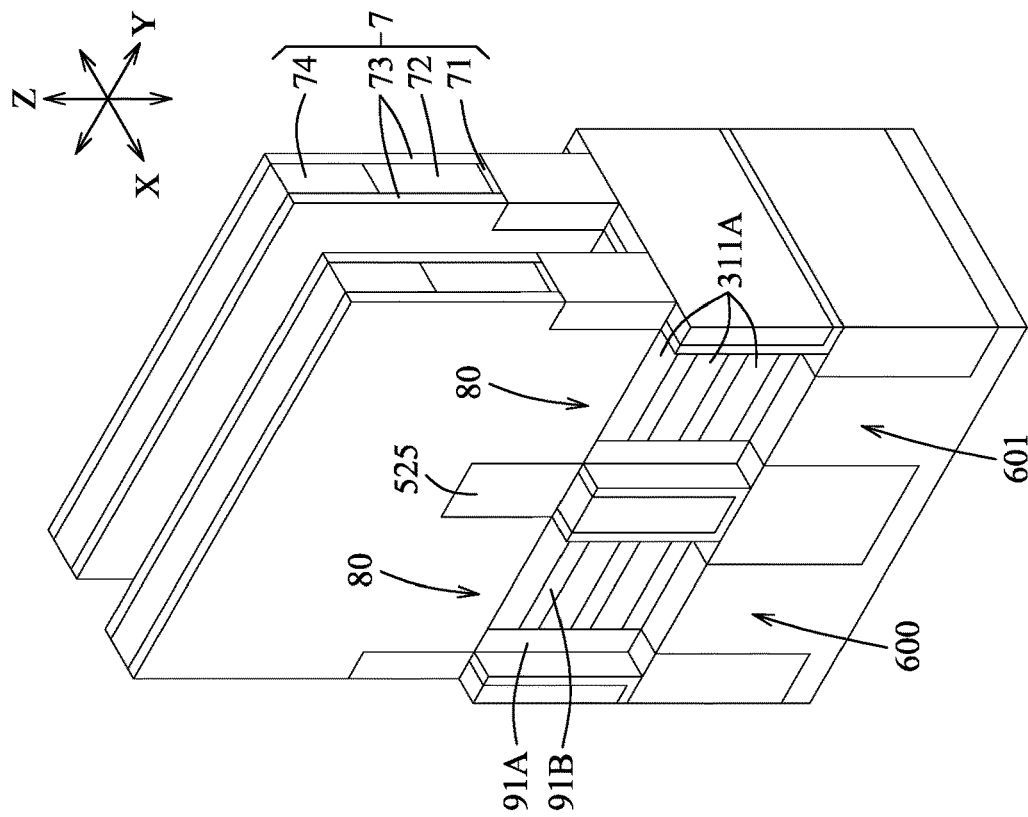

Referring to FIG. 1B and the examples illustrated in FIGS. 11 and 12, the method 100 proceeds to step 111, where first inner spacers 91A and second inner spacers 91B are formed to respectively fill in the inner gaps 90A and the lateral recesses 90B.

In some embodiments, step 111 may include the following sub-steps: (i) forming a spacer layer over the structure shown in FIG. 11, and (ii) removing excess portions of the spacer layer to leave the first inner spacers 91A in the inner gaps 90A, respectively, and to leave the second inner spacers 91B in the lateral recesses 90B, respectively. The spacer layer may be formed by a deposition process, for example, but not limited to, ALD, PVD, CVD, PECVD, plating, other suitable processes, or combinations thereof. Removal of the portions of the spacer layer may be performed using an etching process, for example, but not limited to, a wet etching process, or other suitable techniques. Portions of the spacer layer are removed to expose the ends of the first nanosheet segments 311A. Remaining portions of the spacer layer partially or completely fill in the inner gaps 90A and the lateral recesses 90B so as to form into the first inner spacers 91A and the second inner spacers 91B. Other processes suitable for forming the first and second inner spacers 91A, 91B are within the contemplated scope of the present disclosure.

The spacer layer may include a dielectric material that includes at least one of, for example, but not limited to, silicon (e.g., silicon oxide), nitrogen (e.g., silicon nitride), oxygen (e.g., silicon oxynitride), carbon (e.g., silicon carbide), or the like. The spacer layer may be intrinsic or doped with a dopant, such as an n-type dopant or a p-type dopant. Other suitable materials for the spacer layer are within the contemplated scope of the present disclosure.

Figure 13:
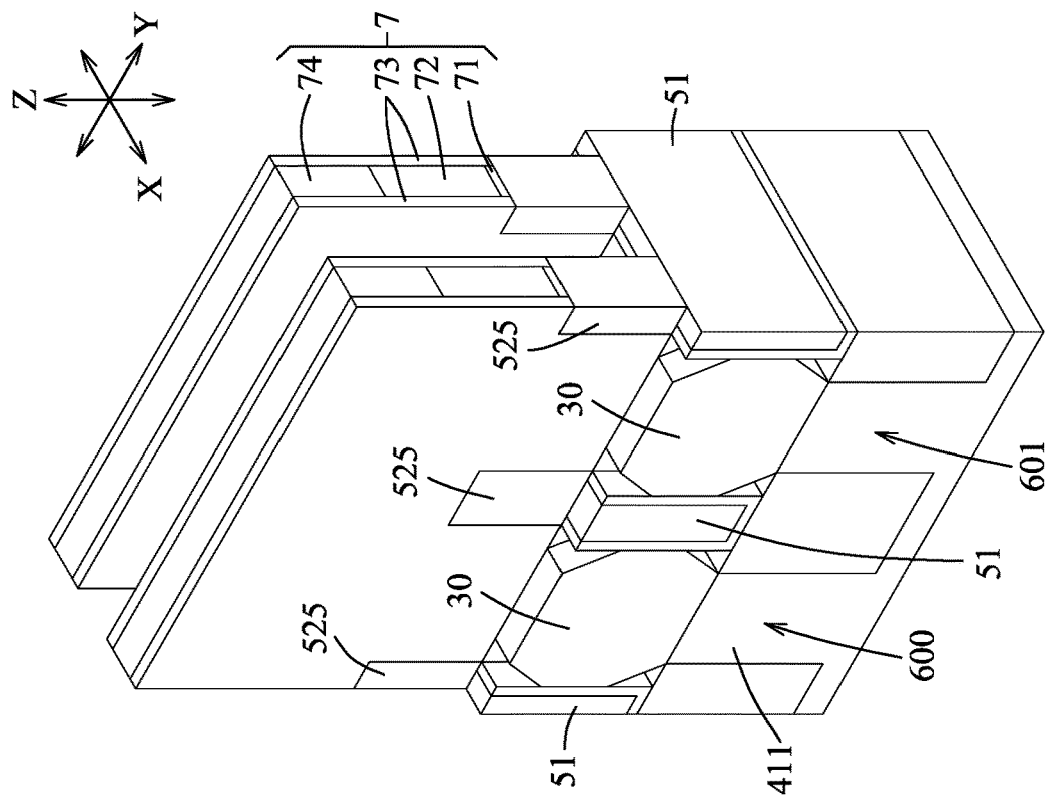

Referring to FIG. 1B and the examples illustrated in FIGS. 12 and 13, the method 100 proceeds to step 112, where two source/drain portions 30 are formed respectively in the source/drain recesses 80 of each of the first and second semiconductor structures 600, 601, and the first and second semiconductor structures 600, 601 each further includes two source/drain portions 30.

In some embodiments, the two source/drain portions 30 are formed to completely fill in the source/drain recesses 80. In some other embodiments, the two source/drain portions 30 do not completely fill the source/drain recesses 80, and the source/drain portions 30 may be spaced apart from the trench isolation elements 43 and/or the isolation structures 5. In certain embodiments, upper surfaces of the source/drain portions 30 are at substantially the same level as an upper surface of the uppermost one of the first nanosheet segments 311A. In alternate embodiments, the upper surfaces of the source/drain portions 30 are at a level slightly higher than the upper surface of the uppermost one of the first nanosheet segments 311A with respect to an upper surface of the substrate segment 411 of the each of the first and second semiconductor structures 600, 601. The source/drain portions 30 may be formed using an epitaxy growth process, which may involve a deposition process such as CVD, but not limited thereto. The epitaxy growth process may implement a precursor which reacts with the material(s) in the substrate segment 411 and/or the first nanosheet segments 311A. In some embodiments, the source/drain portions 30 are not spontaneously formed. For example, a mask may be used during the epitaxy growth process to mask the second semiconductor structure 601 (not yet formed with the source/drain portions 30) so that the source/drain portions 30 of the first semiconductor structure 600 are formed before the source/drain portions 30 of the second semiconductor structure 601. Other processes suitable for forming the source/drain portions 30 are within the contemplated scope of the present disclosure.

In some embodiments, the source/drain portions 30 includes a dopant, such as an n-type dopant, a p-type dopant, or a combination thereof. In certain embodiments, for an n-type transistor, the source/drain portions 30 include silicon and an n-type dopant(s), such as arsenic, phosphorous, carbon, or the like, or combinations thereof. In some embodiments, for a p-type transistor, the source/drain portions 30 include germanium or silicon germanium and a p-type dopant, such as boron, aluminum, or the like, or combinations thereof. Other materials suitable for the source/drain portions 30 are within the contemplated scope of the present disclosure. The dopants in the source/drain portions 30 may be activated using an annealing process, but not limited thereto. The source/drain portions 30 may be doped using an ion implantation process, but not limited thereto. Other processes suitable for doping the source/drain portions 30 are within the contemplated scope of the present disclosure.

Figure 14A:
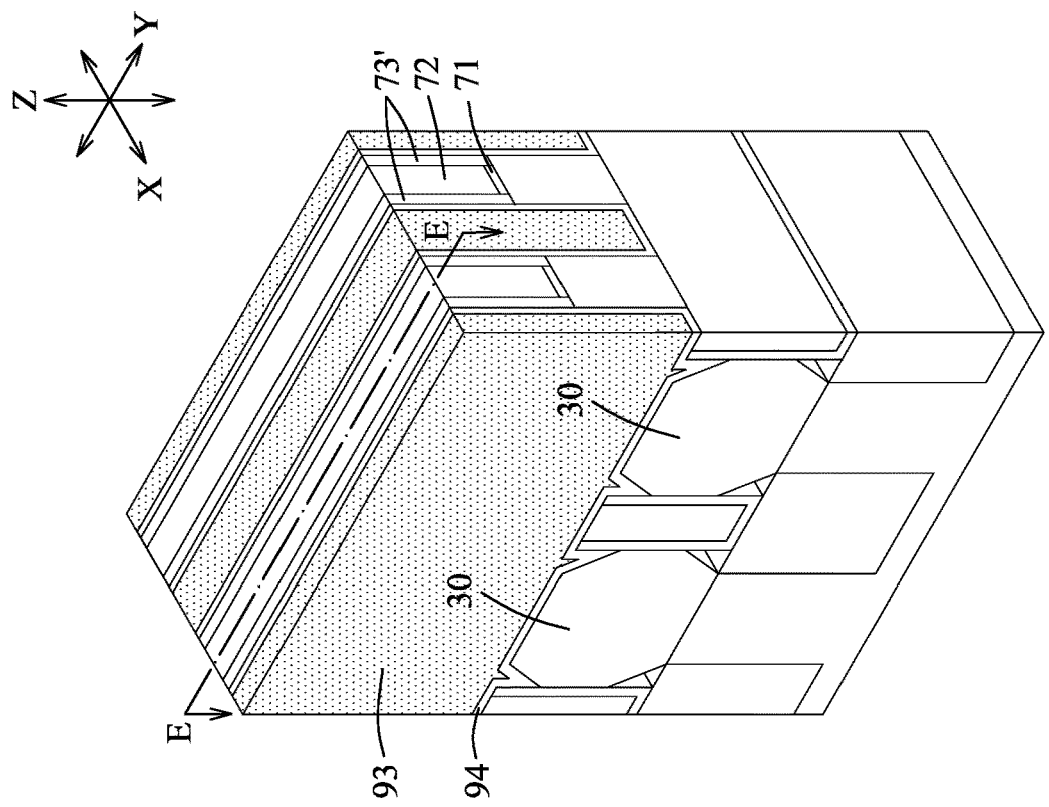

Referring to FIG. 1B and the examples illustrated in FIGS. 13 and 14A, the method 100 proceeds to step 113, where interlayer dielectric (ILD) layers 93 are each disposed to cover corresponding ones of the source/drain portions 30 and portions of the isolation structures 5 aside the corresponding source/drain portions 30 so as to alternate with the gate structures 7. In some embodiments, a plurality of contact etch-stop layers (CESLs) 94 are each formed to separate one of the ILD layers 93 from the corresponding source/drain portions 30, the corresponding remaining portions of the isolation structures 5 (each including the isolation body 51 and the isolation element 525), and two adjacent ones of the gate structures 7.

In some embodiments, step 113 may include the following sub-steps: (i) conformally forming a CESL material layer for forming the CESLs 94 over the structure shown in FIG. 13, (ii) forming an ILD material layer for forming the ILD layers 93 over the CESL material layer so that a space between each two adjacent ones of the gate structures 7 is filled by the CESL and ILD material layers, and (iii) performing a planarization process to remove excess portions of the CESL and ILD material layers to expose the dummy gates 72 of the gate structures 7, thereby obtaining the ILD layers 93 and the CESLs 94. The ILD material layer may be formed by a deposition process. The deposition process may be, for example, but not limited to, ALD, PVD, CVD, HARP, HDP, or the like, or combinations thereof. The CESL material layer may be formed by a deposition process such as, for example, but not limited to, ALD, PVD, CVD, or the like, or combinations thereof. The planarization process may be performed using, for example, CMP, but not limited thereto. During the planarization process, portions of the gate structures 7 (i.e., portions of the gate spacers 73 and the hard masks 74 of the gate structures 7) are removed along with removal of the excess portions of the CESL and ILD material layers. In some other embodiments, the planarization process may be performed to expose the hard masks 74 of the gate structures 7. Other processes suitable for performing step 113 are within the contemplated scope of the present disclosure. After step 113, the remaining gate spacers are denoted by numeral 73'.

The ILD material layer includes a dielectric material such as, for example, but not limited to, silicon oxide, silicon nitride, SiON, phosphosilicate glass (PSG), borophosphosilicate glass (BPSG), spin-on glass (SOG), fluorosilicate glass (FSG), carbon-doped silicon oxide (e.g., SiCOH), xerogel, aerogel, parylene, divinylsiloxane-bis-benzocyclobutene-based (BCB-based) dielectric material, polyimide, or the like, or combinations thereof. The ILD material layer may be a low-k dielectric material (i.e., dielectric material having a dielectric constant less than a dielectric constant of silicon oxide). The ILD material layer may be an extreme low-k dielectric material (i.e., dielectric material having a dielectric constant less than about 2.5). The CESL material layer includes a material different from the dielectric material of the ILD material layer. The CESL material layer may include a dielectric material such as, for example, but not limited to, silicon oxide, silicon nitride, or the like, or combinations thereof. The CESL material layer may include a dielectric material that has a dielectric constant less than a dielectric constant of the dielectric material of the ILD material layer. Other materials suitable for the ILD and CESL material layers are within the contemplated scope of the present disclosure.

Figure 14B:
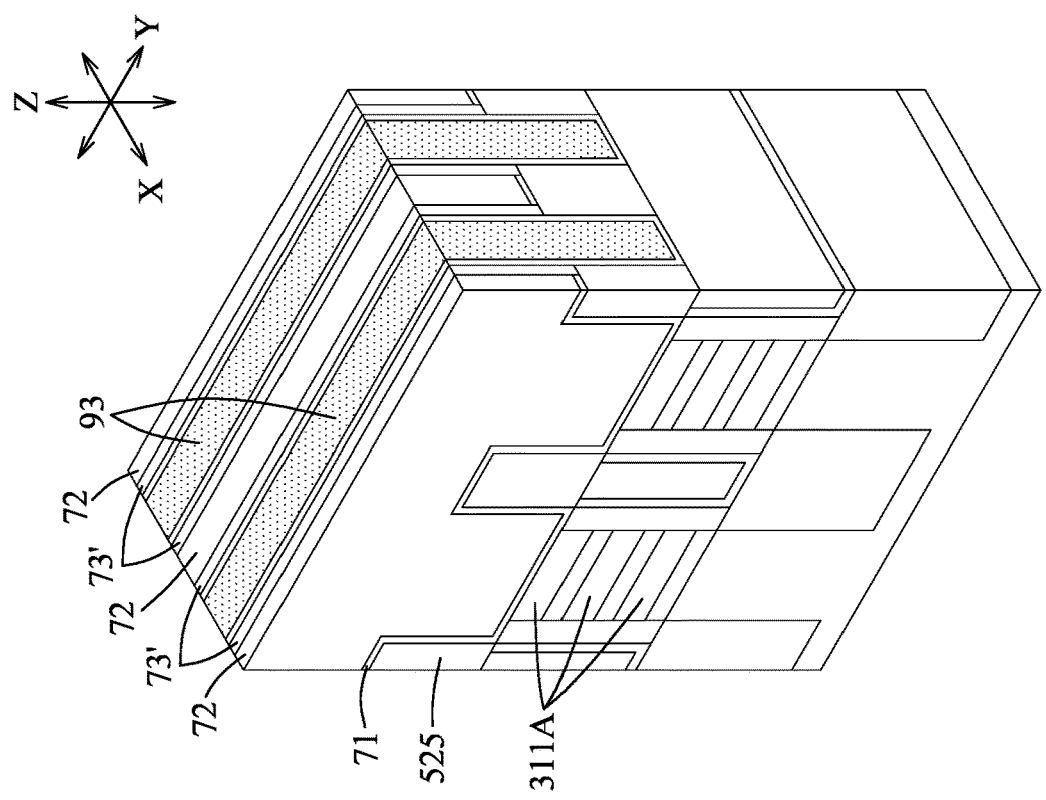

FIG. 14B is a fragmentary perspective cross-sectional view taken along line E-E of FIG. 14A. In some embodiments, after step 113, upper regions of the ILD layers 93 are etched back to form recesses (not shown) using, for example, but not limited to, a selective etching process, and then masking layers 95 (see FIG. 15) are refilled in the recesses. The refilling of the masking layers 95 may be performed by forming a masking material layer over the CESLs 94 and the remaining regions of the ILD layers 93 to fill the recesses, followed by a planarization process to expose the CESLs 94. The material and process for forming the masking layers 95 are similar to those for the CESLs 94, and the details thereof are omitted for the sake of brevity.

Figure 15:
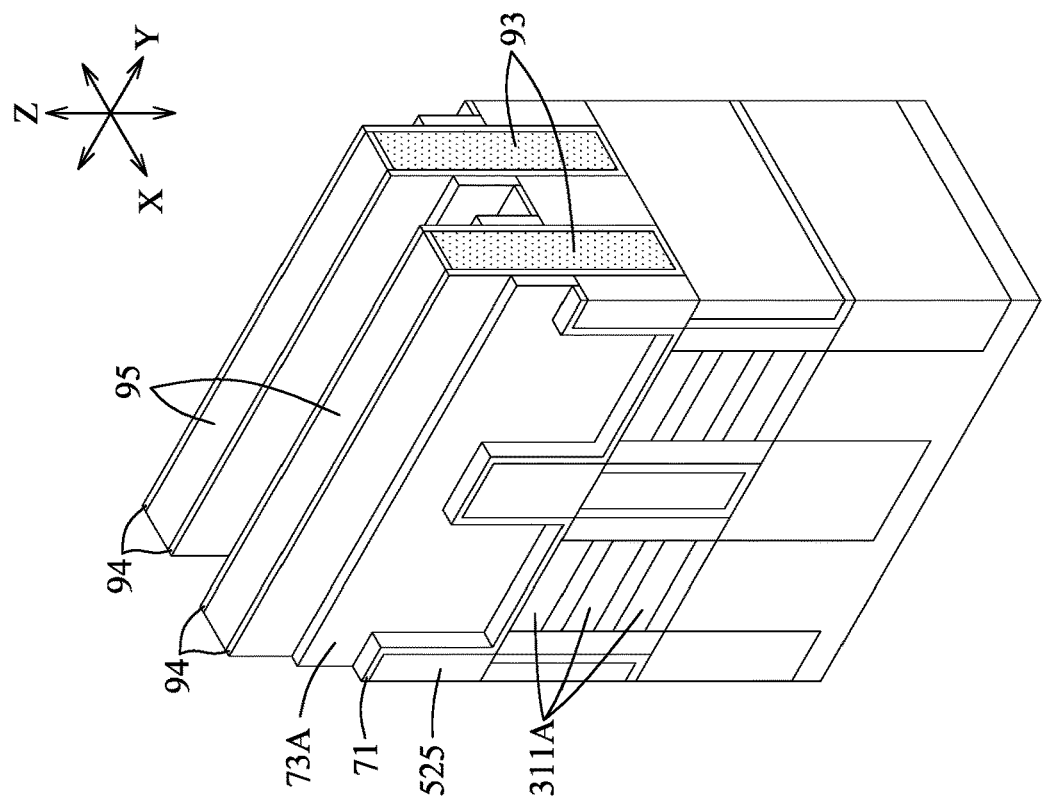

Referring to FIG. 1B and the examples illustrated in FIGS. 14B and 15, the method 100 proceeds to step 114, where the dummy gate 72 of each of the gate structures 7 is removed to expose the dummy dielectric 71. For better understanding, FIGS. 15 to 20 illustrate structures subsequent to the structure shown in FIG. 14B (i.e., after step 113).

The dummy gate 72 may be removed using an etching process. The etching process may be, for example, but not limited to, dry etching, wet etching, or the like. The etching process selectively removes the dummy gate 72 with respect to the dummy dielectric 71. For example, the etching process implements an etchant that has a high etch selectivity for silicon (i.e., the dummy gate 72) compared to silicon oxide (i.e., the dummy dielectric 71) so that the dummy dielectric 71 is not or is not substantially removed during removal of the dummy gate 72. In some embodiments, the etching process may be similar to those described in step 101, but parameter(s) of the etching process (e.g., concentration(s) of etchant(s), flow rate(s) of etchant(s), concentration ratio of etchant(s), bias voltage, a power of a radio frequency source, process pressure, process temperature, wafer temperature, etchant temperature) is tunable to achieve selective removal of the dummy gate 72. Other suitable processes for removal of the dummy gate 72 are within the contemplated scope of the present disclosure.

In some embodiments, as shown in FIG. 15, after removal of the dummy gates 72, the remaining gate spacers 73' may be etched back using, for example, a dry etching process, a wet etching process, other suitable processes, or combinations thereof. Thereafter, the etch-back gate spacers are denoted by the numeral 73A.

Figure 16:
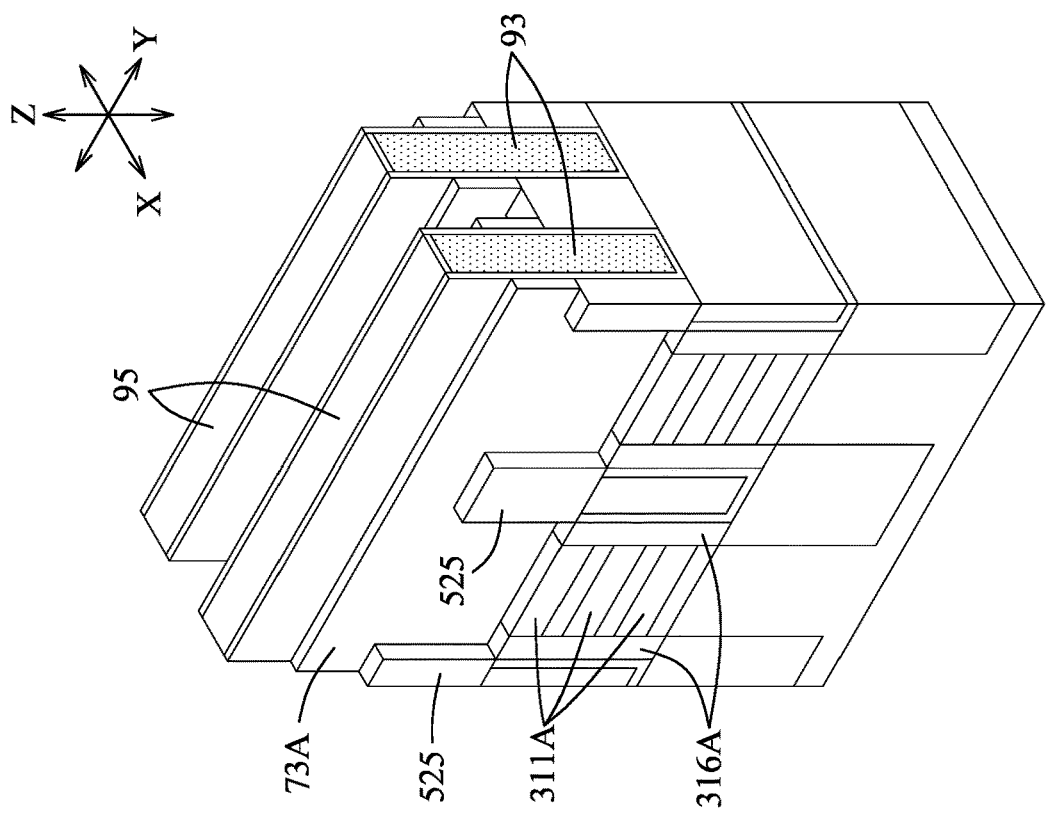
Figure 17C:
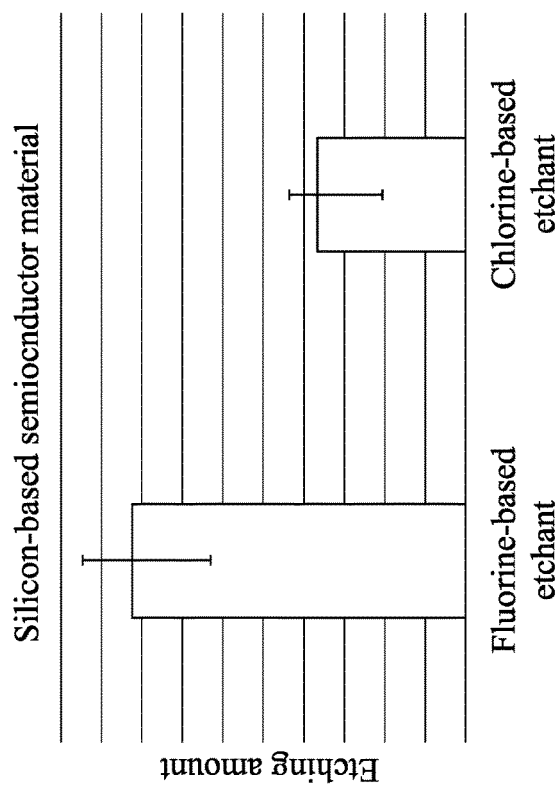
FIG. 17C is a histogram illustrating etching amounts of silicon-based semiconductor material using different etchants in accordance with some embodiments of the present disclosure.
Figure 17B:
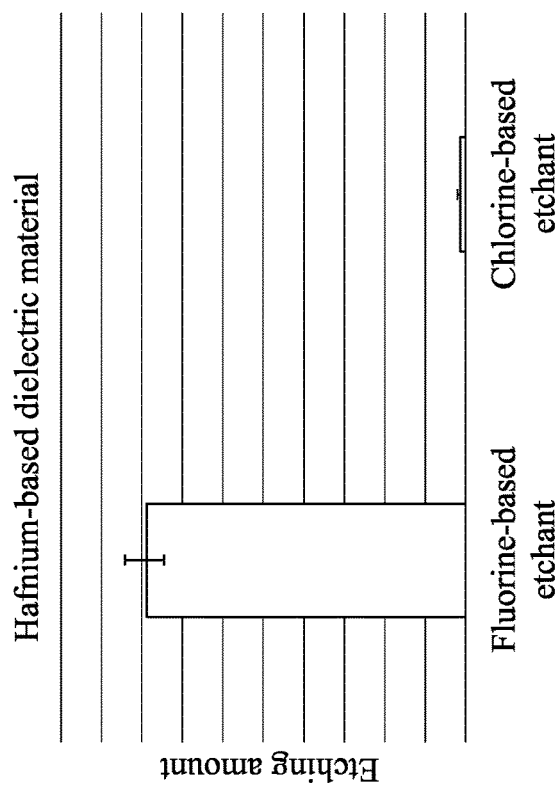
FIG. 17B is a histogram illustrating etching amounts of hafnium-based dielectric material using different etchants in accordance with some embodiments of the present disclosure.

Referring to FIG. 1B and the examples illustrated in FIGS. 15 and 16, the method 100 proceeds to step 115, where the dummy dielectric 71 of each of the gate structures 7 is removed to expose partially the upper surface of the uppermost one of the first nanosheet segments 311A, the isolation elements 525, and remaining regions of the sacrificial bodies 316A.

The dummy dielectric 71 may be removed using an etching process. The etching process may be, for example, but not limited to, dry etching, wet etching, or the like. The etching process selectively removes the dummy dielectric 71 with respect to other features of the structure shown in FIG. 15 (e.g., the first nanosheet segments 311A, the gate spacers 73A, etc.). The etching process implements an etchant that has a high etch selectivity for the dummy dielectric 71 compared to the other features of the structure shown in FIG. 15 so that the other features of the structure is not or is not substantially removed during removal of the dummy dielectric 71. In some embodiments, the etching process may be similar to those described in step 101, but parameter(s) of the etching process (e.g., concentration(s) of etchant(s), flow rate(s) of etchant(s), concentration ratio of etchant(s), bias voltage, a power of a radio frequency source, process pressure, process temperature, wafer temperature, etchant temperature) is tunable to achieve selective removal of the dummy dielectric 71. Other suitable processes for removal of the dummy dielectric 71 are within the contemplated scope of the present disclosure.

Figure 17A:
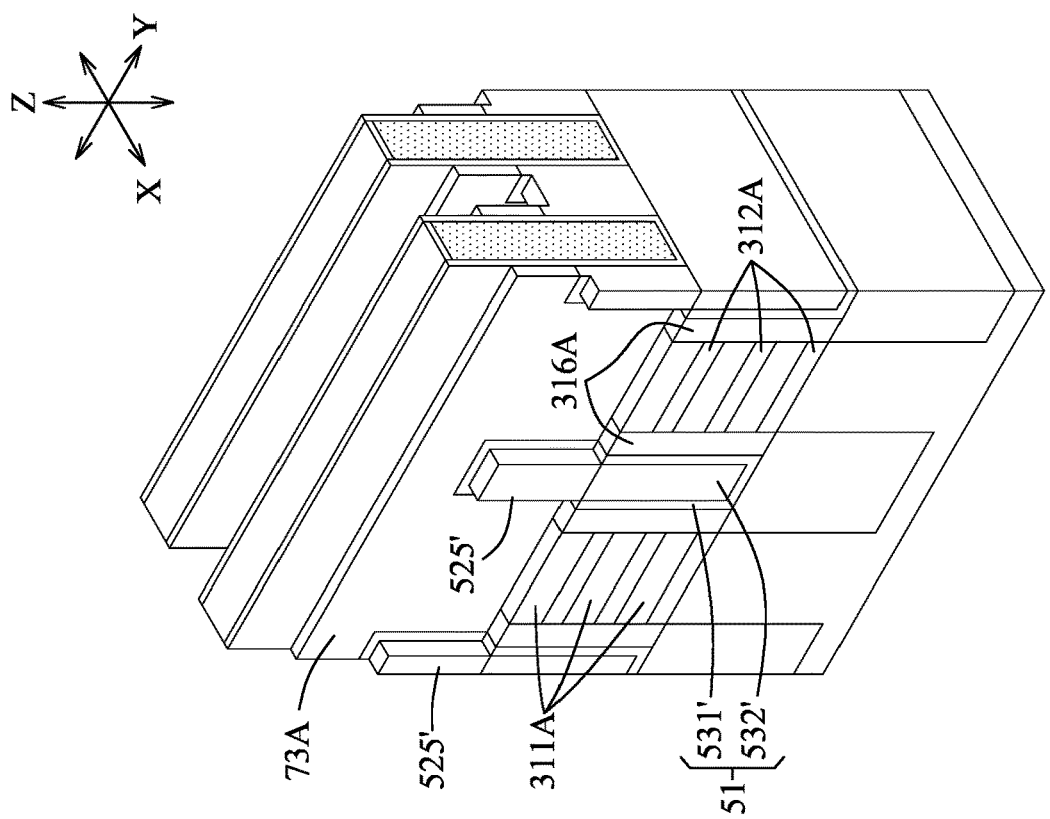

Referring to FIG. 1B and the examples illustrated in FIGS. 16 and 17A, the method 100 proceeds to step 116, where the isolation elements 525, which are exposed from the gate spacers 73A, are trimmed (i.e., etched back in both the Y and Z directions) to expose portions of the upper surfaces of the isolation bodies 51, respectively. The remaining isolation elements are denoted by the numeral 525'. In some embodiments, after step 116, the upper surfaces of the remaining parts 531' of the isolation bodies 51 are exposed.

In some embodiments, the trimming of the isolation elements 525 in step 116 may be performed using an etching process such as, for example, but not limited to, a dry etching process, a wet etching process, or the like, or combinations thereof. The etching process selectively removes portions of the isolation elements 525 with respect to other features of the structure shown in FIG. 16 (e.g., the first nanosheet segments 311A, the gate spacers 73A, the masking layers 95, etc.). The etching process implements an etchant that has a high etch selectivity for the isolation elements 525 compared to the other features of the structure shown in FIG. 16 so that the other features of the structure is not or is not substantially removed during removal of the portions of the isolation elements 525. In some embodiments, the etching process may use an etch gas such as a nitrogen-containing etch gas (e.g., $NH_3$), a halogen-containing etch gas (for example, a chlorine-containing etch gas such as $Cl_2$, $SiCl_4$, $BCl_3$, $CHCl_3$, $CCl_4$, or the like, or combinations thereof, a fluorine-containing etch gas such as $F_2$, $NF_3$, $C_xF_y$, $CH_xF_y$, HF, $SF_6$, or the like, or combinations thereof), a hydrogen-containing etch gas (e.g., $H_2$), or the like, or combinations thereof, but not limited thereto. The etching process may use a carrier gas to deliver the etch gas. In certain embodiments, the etching process implements an etch mask that covers portions of the isolation elements 525 which are to be remained (i.e., the remaining isolation elements 525'). The remaining isolation elements 525' are disposed to cover the remaining parts 532', respectively. The etching process may use a solution containing a wet etchant (i.e., a wet etchant solution). The wet etchant solution may include $NH_4OH$, $H_2SO_4$, $H_2O_2$, HCl, $H_2O$, HF, $HNO_3$, diluted HF, $O_3$, $H_3PO_4$, or the like, or combinations thereof. Other suitable processes for trimming the isolation elements 525 are within the contemplated scope of the present disclosure. Parameter(s) of the removal process (e.g., concentration(s) of etchant(s), flow rate(s) of etchant(s), concentration ratio of etchant(s), bias voltage, a power of a radio frequency source, process pressure, process temperature, wafer temperature, etchant temperature) is tunable to achieve trimming of the isolation elements 525.

The remaining isolation elements 525' may each have a length in the Y direction that ranges from about 2.5 nm to about 5 nm. In some embodiments, each of the remaining isolation elements 525' has a rectangular or a square configuration (i.e., upper and lower surfaces of each of the remaining isolation elements 525' have substantially the same area, and projections thereof are overlapped in the Z direction). In some other embodiments, in each of the remaining isolation elements 525', the upper surface has a dimension smaller than that of the lower surface (for example, the upper surface has a length in the Y direction that is about 0.5 nm to about 1.5 nm shorter than that of the lower surface). The lower surfaces of the remaining isolation elements 525' are in contact with the upper surfaces of the remaining parts 532' of the isolation bodies 51, respectively. The trimming of the isolation elements 525 is advantageous for forming a metal gate structure(s) in later steps of the method 100 (i.e., after trimming the isolation elements 525, a space for forming the metal gate structure(s) may have an enlarged volume). In some embodiments, when the isolation elements 525 include hafnium, a fluorine-based etchant is used for trimming the isolation elements 525, because the hafnium-including isolation element can be more effectively etched using a fluorine-based etchant compared to a chlorine-based etchant (see FIG. 17B). However, since a relatively large amount of silicon material may be etched using a fluorine-based etchant compared to a chlorine-based etchant (see FIG. 17C), the uppermost one of the first nanosheet segments 311A in each of the first and second semiconductor structures 600, 601 may be undesirably damaged during trimming of the isolation elements 525. To solve this issue, the hafnium in the isolation elements 525 is replaced by the rare-earth elements. In this case, a fluorine-free etchant (for example, a chlorine-based etchant) may be used for trimming the isolation elements 525 including the rare-earth elements, and thus, the first nanosheet segments 311A may have larger thicknesses compared to the case of using the fluorine-based etchant. Although this disclosure is not bound by any theory, it is believed that a bonding strength between hafnium and oxygen is stronger than a bonding strength between rare-earth element (for example, terbium (Tb)) and oxygen. As such, the isolation elements 525 can be trimmed using the fluorine-free etchant.

Figure 18:
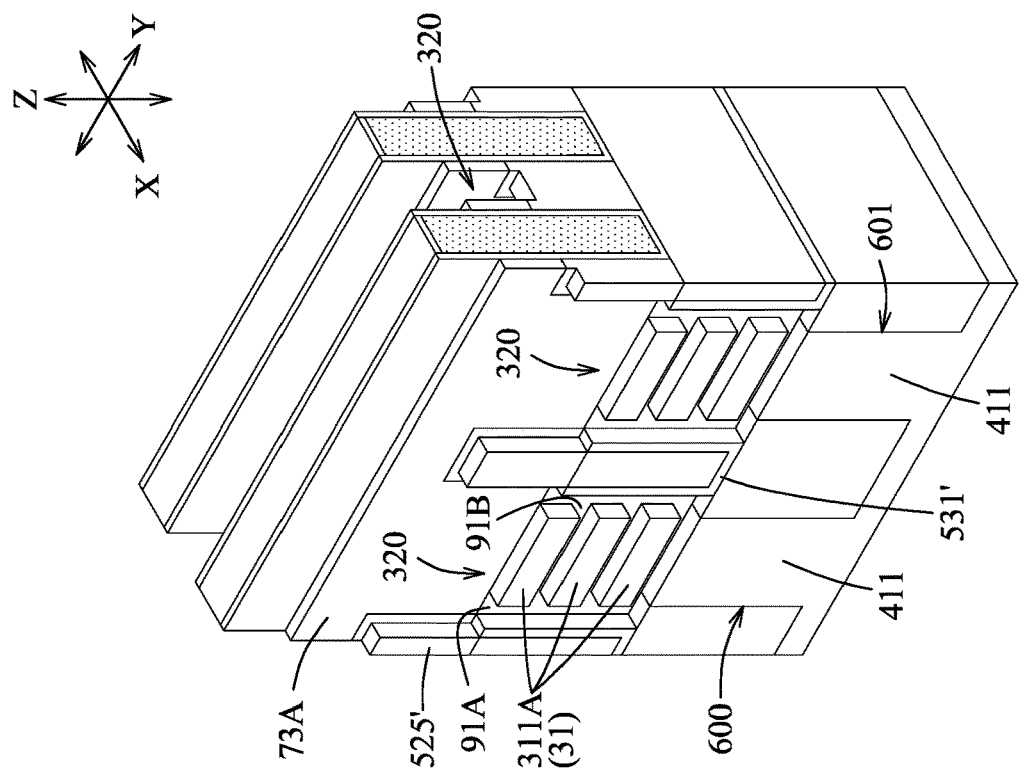

Referring to FIG. 1B and the examples illustrated in FIGS. 17A and 18, the method 100 proceeds to step 117, where the remaining regions of the sacrificial bodies 316A and remaining regions of the second nanosheet segments 312A are removed so that the first nanosheet segments 311A, the first inner spacers 91A, the second inner spacers 91B, and parts of the substrate segments 411 located under the first nanosheet segments 311A of the first and second semiconductor structures 600, 601 are exposed, and metal gate openings 320 are formed. The first nanosheet segments 311A in each of the first and second semiconductor structures 600, 601 serve as a channel portion 31 of the device 200A shown in FIG. 21A.

In some embodiments, step 117 may be performed using an etching process such as, for example, but not limited to, a dry etching process, or the like, or combinations thereof. The etching process selectively removes the remaining regions of the sacrificial bodies 316A and the remaining regions of the second nanosheet segments 312A with respect to other features of the structure shown in FIG. 17A (e.g., the first nanosheet segments 311A, the gate spacers 73A, etc.). The etching process implements an etchant that has a high etch selectivity for the remaining regions of the sacrificial bodies 316A and the remaining regions of the second nanosheet segments 312A compared to the other features of the structure so that the other features of the structure is not or is not substantially removed during step 117. In some embodiments, the etching process may use an etch gas such as a nitrogen-containing etch gas (e.g., $NH_3$), a halogen-containing etch gas (for example, a fluorine-containing etch gas such as $F_2$, $NF_3$, $C_xF_y$, $CH_xF_y$, HF, $SF_6$, $ClF_3$, or the like, or combinations thereof), a hydrogen-containing etch gas (e.g., $H_2$), or the like, or combinations thereof, but not limited thereto. The etching process may use a carrier gas to deliver the etch gas. The etching process may be performed at a temperature ranging from about −10° C. to about 60° C. In some embodiments, the etching process may include multiple steps so that the remaining regions of the sacrificial bodies 316A and the remaining regions of the second nanosheet segments 312A are not removed completely in one step. For example, the remaining regions of the sacrificial bodies 316A may be removed before removal of the remaining regions of the second nanosheet segments 312A. Other suitable processes for removal of the remaining regions of the sacrificial bodies 316A and the remaining regions of the second nanosheet segments 312A are within the contemplated scope of the present disclosure. Parameter (s) of the removal process (e.g., concentration(s) of etchant (s), flow rate(s) of etchant(s), concentration ratio of etchant (s), bias voltage, a power of a radio frequency source, process pressure, process temperature, wafer temperature, etchant temperature) is tunable to achieve removal of the remaining regions of the sacrificial bodies 316A and the remaining regions of the second nanosheet segments 312A.

After step 117, each of the first nanosheet segments 311A may have a thickness in the Z direction that ranges from about 6 nm to about 7 nm, and a length in the Y direction that ranges from about 15.5 nm to about 37 nm. Since the uppermost one of the first nanosheet segments 311A in each of the first and second semiconductor structures 600, 601 is less likely to be damaged during step 116, the first nanosheet segments 311A may have more uniform thicknesses compared to the case of using the fluorine-based etchant in step 116.

Figure 19:
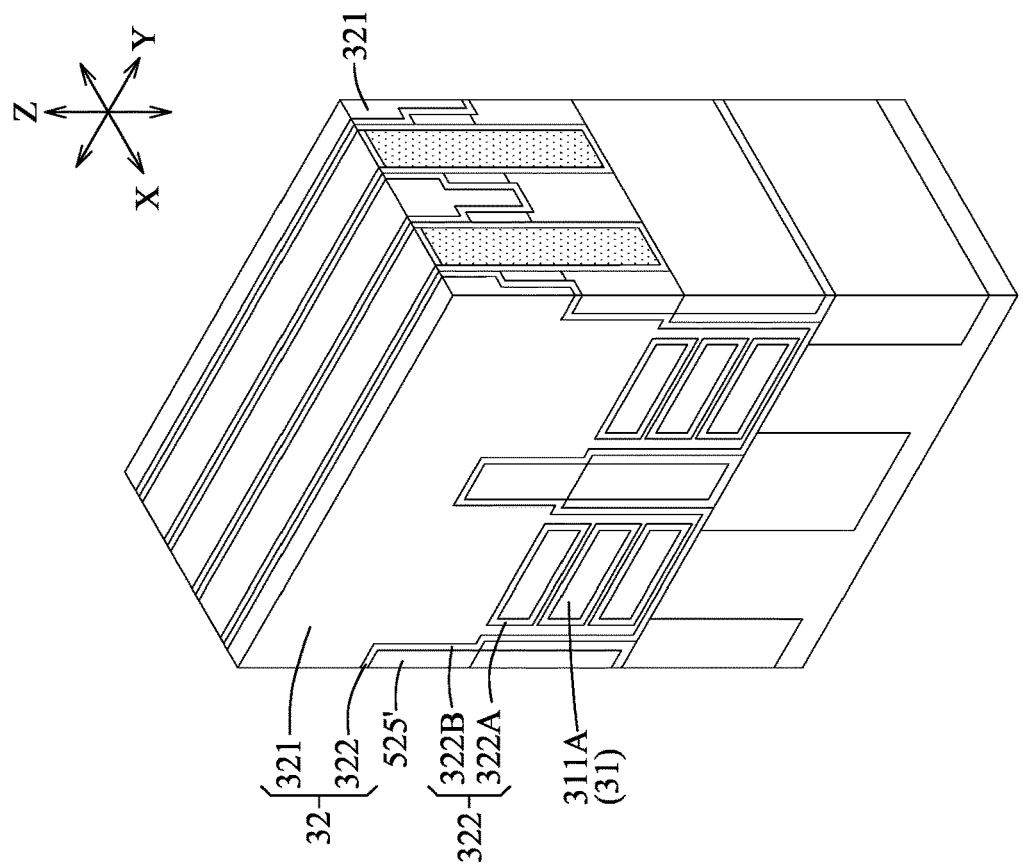

Referring to FIG. 1B and the examples illustrated in FIGS. 18 and 19, the method 100 proceeds to step 118, where metal gate structures 32 are formed in the metal gate openings 320 to surround the channel portion 31 (i.e., surrounding the first nanosheet segments 311A). In addition, the metal gate structures 32 are each in contact with corresponding ones of the first inner spacers 91A, corresponding ones of the second inner spacers 91B, and corresponding ones of the exposed parts of the substrate segments 411 in step 117, corresponding ones of the exposed surfaces of the remaining parts 531' in step 117, corresponding ones of the remaining isolation elements 525', and corresponding ones of the gate spacers 73A. The metal gate structures 32 may each include a gate electrode 321 and a gate dielectric 322 having a first dielectric region 322A that is disposed to separate the gate electrode 321 from the first nanosheets 311, and a second dielectric region 322B that is disposed to separate the gate electrode 321 from two adjacent ones of the source/drain portions 30 in the X direction.

In some embodiments, step 118 may include the following sub-steps: (i) conformally forming a gate dielectric layer for forming the gate dielectric 322 over the structure shown in FIG. 18, (ii) forming a gate electrode layer for forming the gate electrode 321 on the gate dielectric layer to fully fill the metal gate openings 320, and (iii) performing a planarization process to remove excess portions of the gate dielectric layer and the gate electrode layer so as to form the metal gate structures 32. The gate dielectric layer and the gate electrode layer may each be formed using a deposition process, such as ALD, CVD, PVD, or the like, or combinations thereof. The planarization process may be, for example, CMP, or the like, but not limited thereto. Other suitable processes for forming the metal gate structures 32 are within the contemplated scope of the present disclosure.

The gate dielectric layer includes a high-k dielectric material such as, for example, but not limited to, Hf-based dielectric materials, Zr-based dielectric materials, Al-based dielectric materials, Ti-based dielectric materials, Ba-based dielectric materials, RE element-based dielectric materials, nitrides, or the like, or combinations thereof. The gate electrode layer includes a conductive material such as, for example, but not limited to, a metal (e.g., copper, aluminum, titanium, tantalum, cobalt, tungsten, or the like, or alloys thereof), polysilicon, metal-containing nitrides (e.g., TaN), metal-containing silicides (e.g., NiSi), metal-containing carbides (e.g., TaC), or the like, or combinations thereof. Other suitable materials for forming the gate dielectric layer and the gate electrode layer are within the contemplated scope of the present disclosure.

Figure 20:
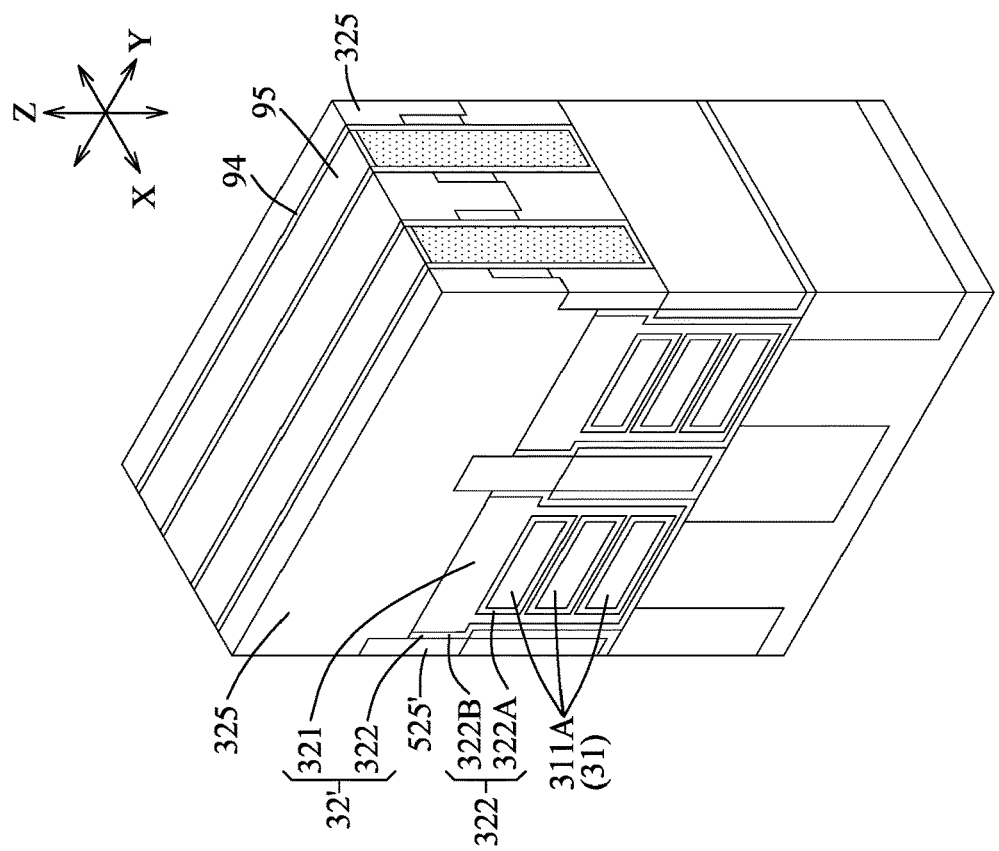

Referring to FIG. 1B and the examples illustrated in FIG. 20, the method 100 proceeds to step 119, where a portion of the gate electrode 321 and a portion of the gate dielectric 322 of each of the metal gate structures 32 are removed. In some embodiments, in step 119, an upper portion (i.e., the portion of the gate electrode 321 and the portion of the gate dielectric 322) of each of the metal gate structures 32 is replaced with a self-aligned contact (SAC) 325. After step 119, remaining metal gate structures may be referred to as gate portions 32' of the device 200A shown in FIG. 21A.

Removal of the portion of the gate electrode 321 and the portion of the gate dielectric 322 may be performed using an etching process such as, for example, but not limited to, a dry etching process, or the like, or combinations thereof. The etching process selectively removes the portion of the gate electrode 321 and the portion of the gate dielectric 322 with respect to other features of the structure shown in FIG. 19 (e.g., the isolation elements 525', etc.). The etching process implements an etchant that has a high etch selectivity for the portion of the gate electrode 321 and the portion of the gate dielectric 322 compared to the other features of the structure so that the other features of the structure is not or is not substantially removed during removal of the portion of the gate electrode 321 and the portion of the gate dielectric 322. In some embodiments, the etching process may be similar to those described in step 101, but parameter(s) of the etching process (e.g., concentration(s) of etchant(s), flow rate(s) of etchant(s), concentration ratio of etchant(s), bias voltage, a power of a radio frequency source, process pressure, process temperature, wafer temperature, etchant temperature) is tunable to achieve selective removal of the portion of the gate electrode 321. Other suitable processes for removal of the portion of the gate electrode 321 and the portion of the gate dielectric 322 are within the contemplated scope of the present disclosure.

The SAC 325 may be formed using a deposition process such as, for example, but not limited to, ALD, CVD, PVD, plating, or the like, or combinations thereof. After forming the SAC 325, a planarization process, such as CMP, or the like, may be performed to remove an excess of the SAC 325. Other processes suitable for forming the SAC 325 are within the contemplated scope of the present disclosure.

The SAC 325 may include a low-k dielectric material with a dielectric constant (k) of not greater than about 7, for example, but not limited to, silicon oxide (e.g., $SiO_2$), silicon nitride, silicon carbide, boron nitride, boron carbide, or the like, or combinations thereof. Other materials suitable for the SAC 325 are within the contemplated scope of the present disclosure.

Figure 21A:
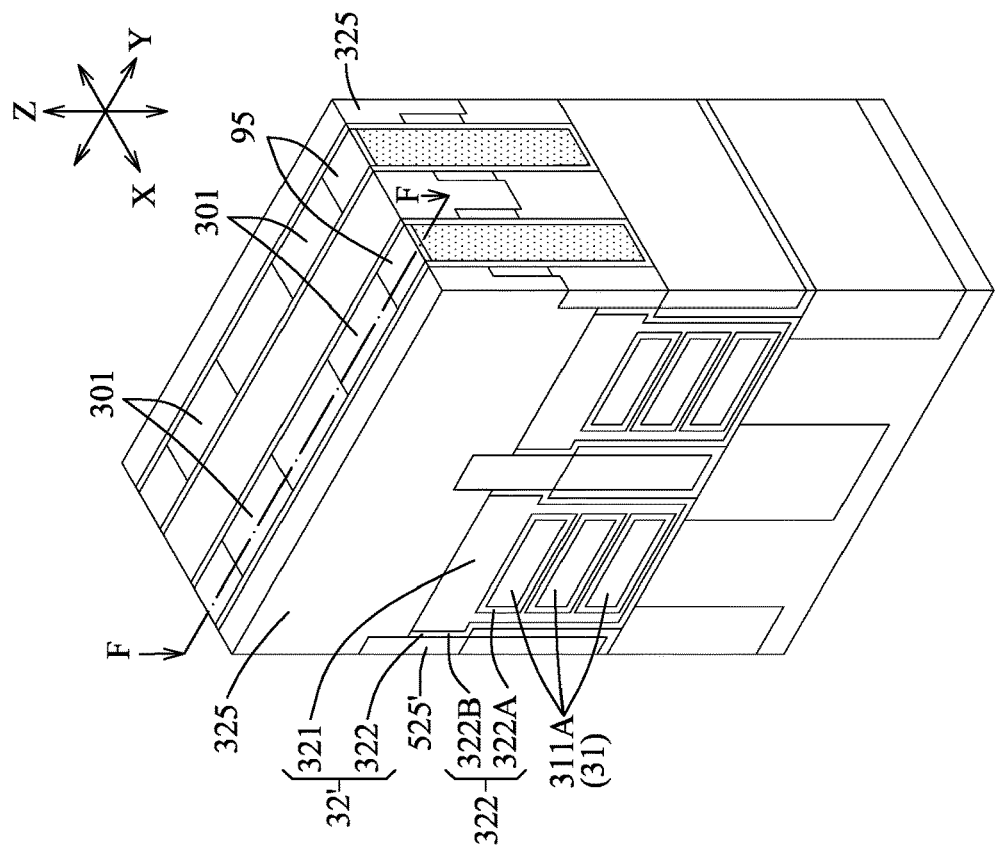
Figure 21B:
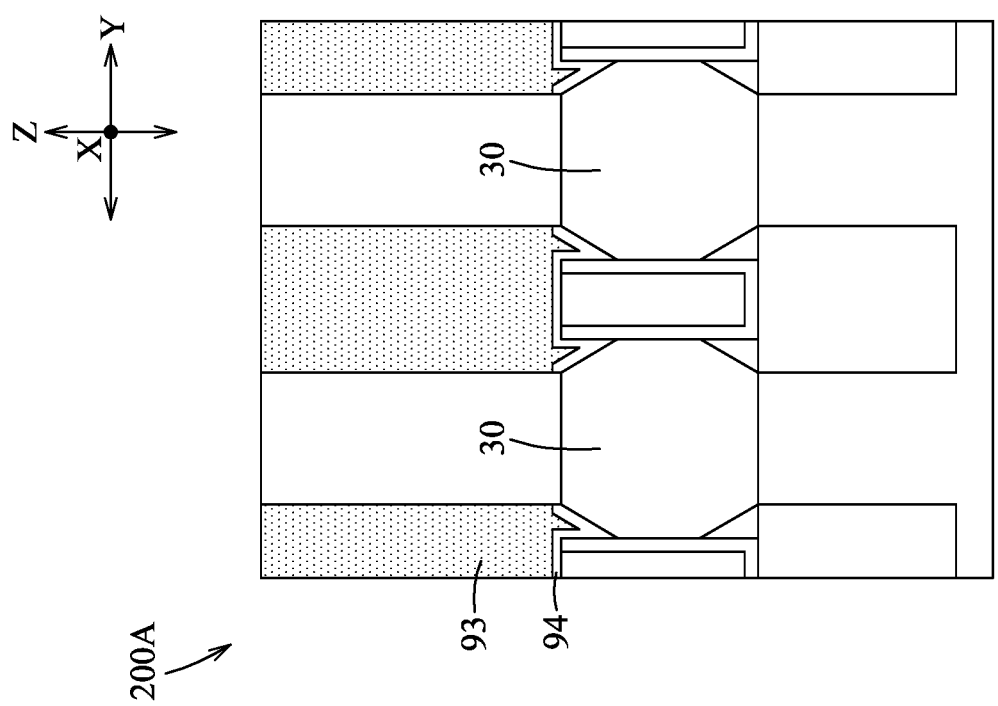
FIG. 21B is a cross-sectional view taken along line F-F of the device shown in FIG. 21A in accordance with some embodiments of the present disclosure.

Referring to FIG. 1B and the examples illustrated in FIGS. 21A and 21B, the method 100 proceeds to step 120, where source/drain contacts 301 are formed to contact with the source/drain portions 30. FIG. 21A is a fragmentary perspective cross-sectional view of the device 200A formed with the source/drain contacts 301 in accordance with some embodiments of the present disclosure. FIG. 21B is a cross-sectional view of the device 200A taken along line F-F in FIG. 21A.

The source/drain contacts 301 may be formed using an etching process and/or a lithography process. In some embodiments, a patterned mask layer is formed on the device 200A using a lithography process. The patterned mask layer is used in the etching process for forming source/drain contact openings, each of which extends through a corresponding one of the masking layers 95, a corresponding one of the ILD layers 93, and a corresponding one of the CESLs 94 to expose a corresponding one of the source/drain portions 30. The etching process may be, for example, but not limited to, a dry etching process, a wet etching process, or the like. To form the source/drain contacts 301, a conductive material is filled in the source/drain contact openings, followed by removing an excess of the conductive material. The conductive material may be, for example, but not limited to, copper, tungsten, cobalt, ruthenium, aluminum, palladium, nickel, platinum, a low resistivity metal constituent, or the like, or combinations thereof. The conductive material may be filled in the source/drain contact openings using a deposition process, such as, for example, but not limited to, ALD, CVD, PVD, plating, or the like. Removal of the excess of the conductive material may be, for example, but not limited to, a planarization process, such as CMP, or the like. The planarization process is performed to expose the masking layers 95.

Figure 22:
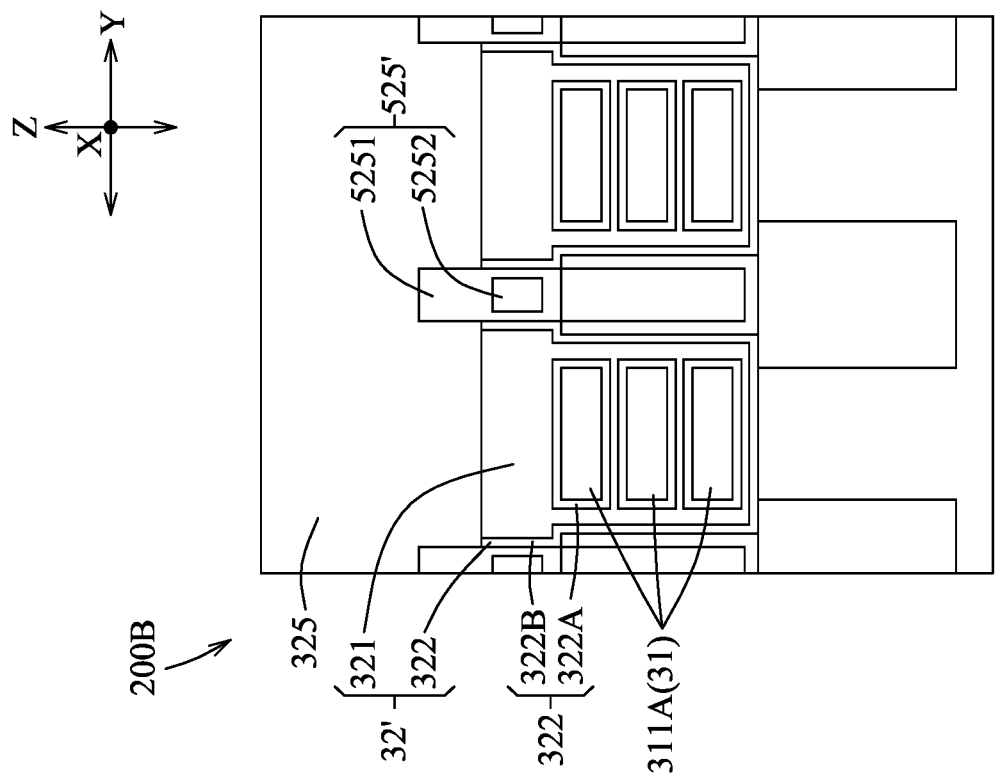
FIG. 22 is a cross-sectional view of the device in accordance with some other embodiments of the present disclosure.

FIG. 22 is a cross-sectional view illustrating a device 200B in accordance with some embodiments. Some repeating structures are omitted in FIG. 22 for the sake of brevity. The device 200B is similar to the device 200A shown in FIGS. 21A and 21B except for the configurations of the isolation elements 525'. In FIG. 22, the isolation elements 525' each includes an outer element 5251 and an inner element 5252. The outer element 5251 includes the first dielectric material, and the inner element 5252 includes a third dielectric material having a dielectric constant lower than that of the first dielectric material and is surrounded by the outer element 5251. The device 200B may be made using a method similar to the method 100, and the details thereof are omitted for the sake of brevity.

In some embodiments, the third dielectric material may be, for example, but not limited to, a silicon-based dielectric material (e.g., SiCO, SiONC, SiOCN, SiCN, or the like), a boron-based dielectric material (e.g., BN, $B_2N$, BCON, BCN, BON, or the like), or the like. The silicon-based dielectric material may have a Si composition ranging from about 23% to about 50%. The boron-based dielectric material may have a boron composition ranging from about 45% to about 58%. The silicon-based dielectric material may have an oxygen composition ranging from about 5% to about 60%. The boron-based dielectric material may have an oxygen composition ranging from about 5% to about 20%. The silicon-based dielectric material may have a nitrogen composition ranging from 0% to about 50%. The boron-based dielectric material may have a nitrogen composition ranging from about 20% to about 45%. The silicon-based dielectric material may have a carbon composition ranging from about 3% to about 56%. Other materials suitable for the third dielectric material are within the contemplated scope of the present disclosure.

To be noted is that some steps in the method 100 may be modified, replaced, or eliminated without departure from the spirit and scope of the present disclosure, and those steps may not be in the order mentioned above. In alternative embodiments, other suitable methods may also be applied for forming the device 200A or 200B.

Figure 23B:
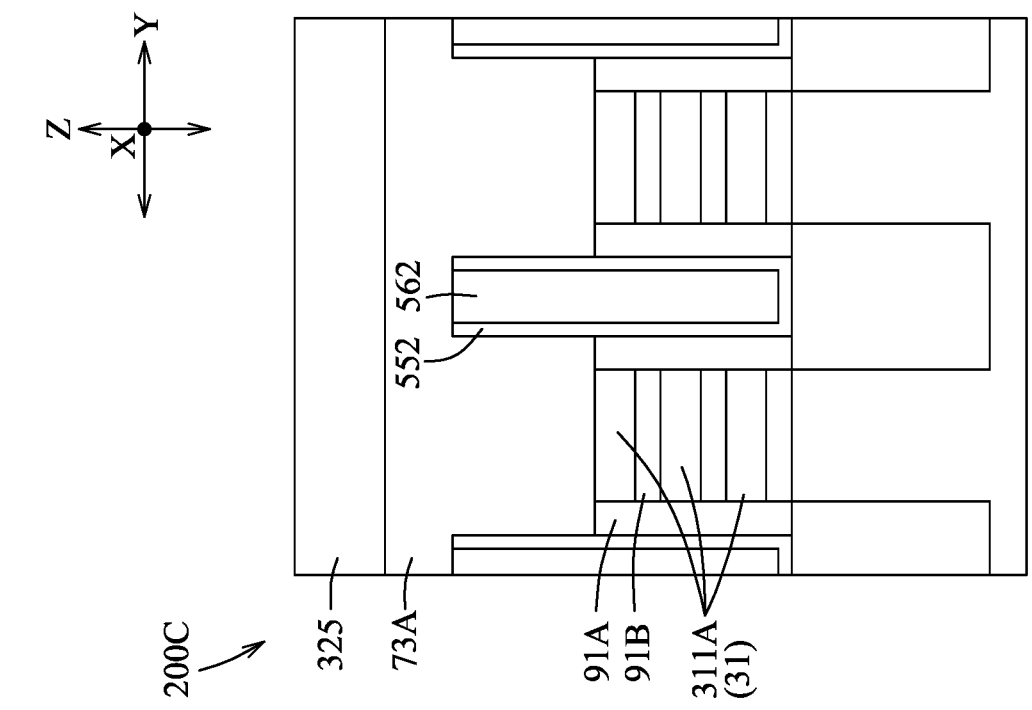
FIG. 23B is a cross-sectional view taken along line G-G of the device shown in FIG. 23A in accordance with some embodiments of the present disclosure.
Figure 23A:
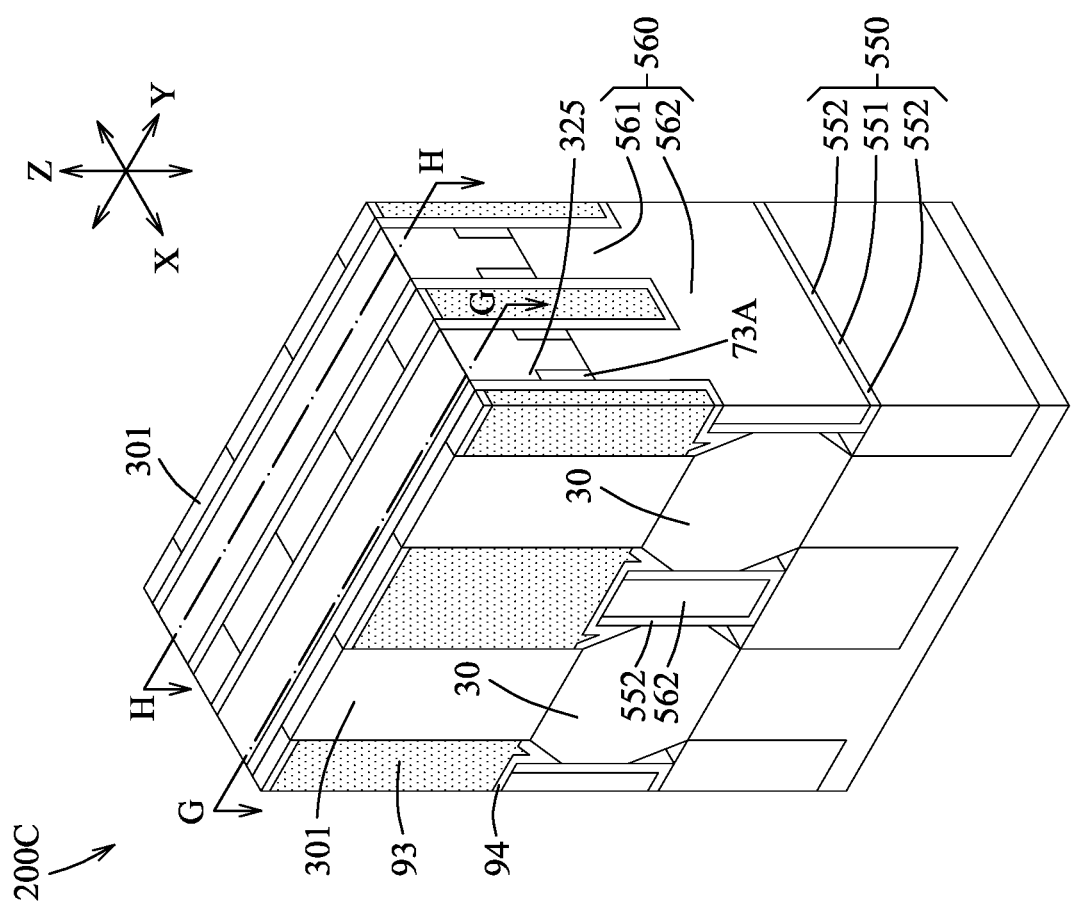
FIG. 23A is a fragmentary perspective cross-sectional view of the device in accordance with yet some other embodiments of the present disclosure.

FIG. 23A is a fragmentary perspective cross-sectional view illustrating a device 200C in accordance with some embodiments. The device 200C is similar to the device 200A except for the configurations of the isolation structures 5. FIG. 23B is a cross-sectional view taken along line G-G of FIG. 23A in accordance with some embodiments. FIG. 23C a cross-sectional view taken along line H-H of FIG. 23A in accordance with some embodiments. Some repeating structures are omitted in FIGS. 23A to 23C and the following figures (FIGS. 23D to 23G) for the sake of brevity. For manufacturing the device 200C, a method 100' may be used. The method 100' is similar to the method 100 except that in the method 100', steps 105 and 106 are omitted, and steps 104, 109, 116 and 117 are altered. Additional steps can be provided before, after or during the method 100', and some of the steps described herein may be replaced by other steps or be eliminated.

In step 104 of the method 100', when forming the first dielectric elements 53 (see also FIG. 5), the first dielectric film 531 is made of a material the same as or similar to that of the isolation elements 525', and the first dielectric body 532 is made of the low-k dielectric material described in step 104 of the method 100. The first dielectric elements 53 obtained in step 104 of the method 100' can be used to replace the isolation structures 5 shown in FIG. 8. In the method 100', the first dielectric film 531 shown in FIG. 5 may serve as an isolation feature of each of the isolation structures 5, and the first dielectric body 532 shown in FIG. 5 may serve as an isolation body of each of the isolation structures 5.

Figure 23D:
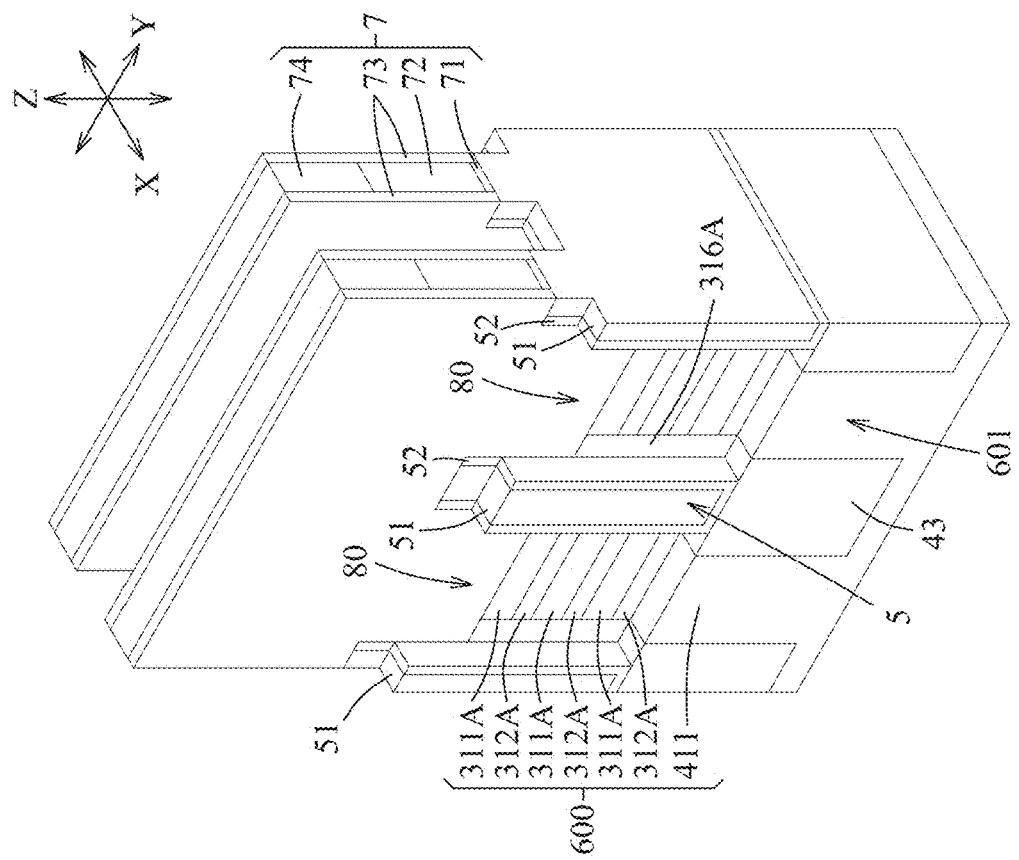
FIGS. 23D to 23G are fragmentary perspective cross-sectional views illustrating intermediate stages of another method in accordance with some embodiments of the present disclosure.
Figure 23C:
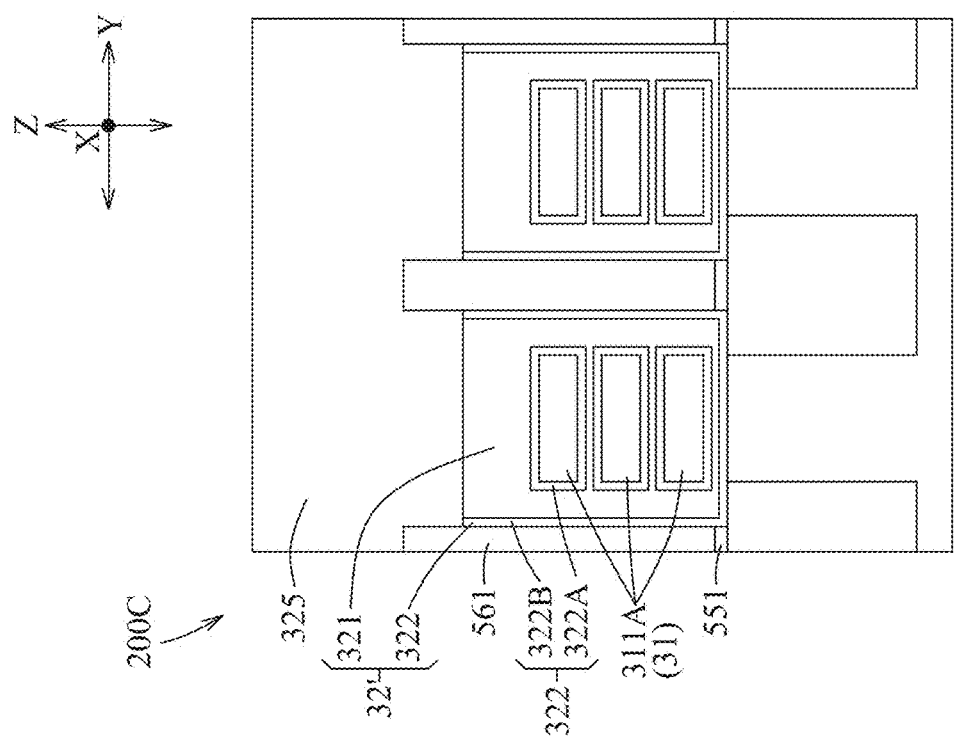
FIG. 23C is a cross-sectional view taken along line H-H of the device shown in FIG. 23A in accordance with some embodiments of the present disclosure.

In step 109 of the method 100', the isolation structures 5 exposed from the gate structures 7 are also etched to have a reduced height in the Z direction (see FIG. 23D). After step 109, the remaining isolation feature of each of the isolation structures 5 is denoted by the numeral 52 and the remaining isolation body of each of the isolation structures 5 is denoted by the numeral 51. In step 109, a by-product layer, which is formed by etching the isolation feature, can protect the isolation body from being unduly etched. In some embodiments, after removal of the by-product layer, the isolation structures 5 are further etched back (i.e., both the isolation feature 52 and the isolation body 51 exposed from the gate structures 7 are recessed in the Z direction) to obtain a structure shown in FIG. 23E. In some other embodiments, the etching back of the isolation feature 52 may be performed at any steps after step 109 and before step 113.

Figure 23F:
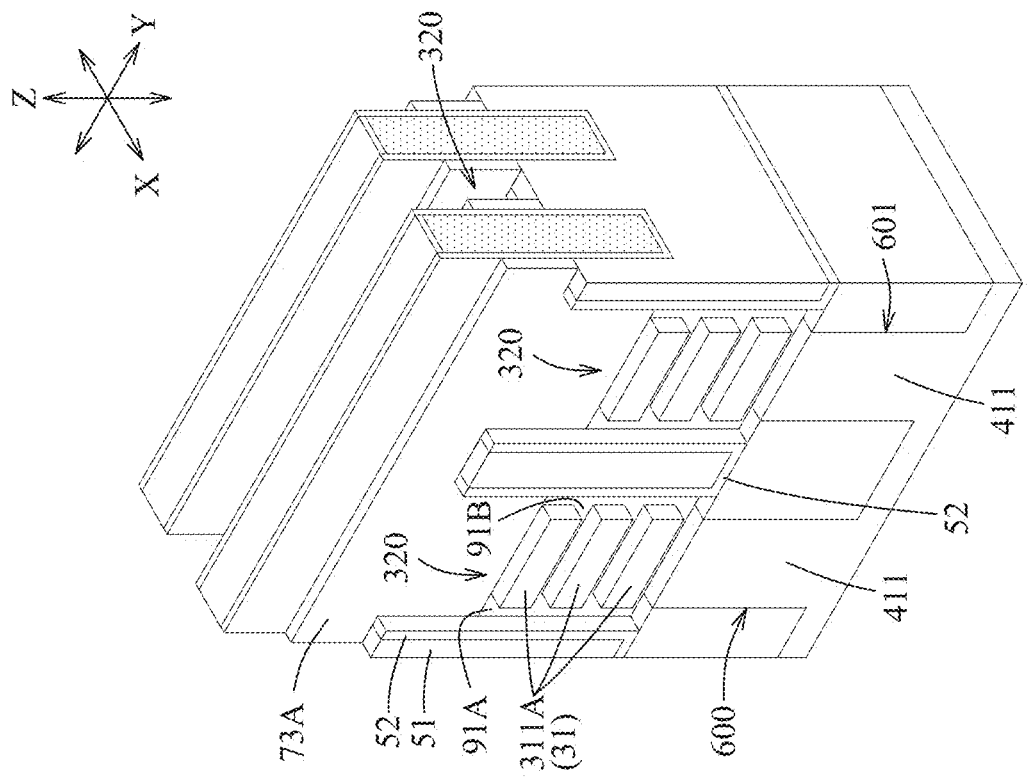
Figure 23E:
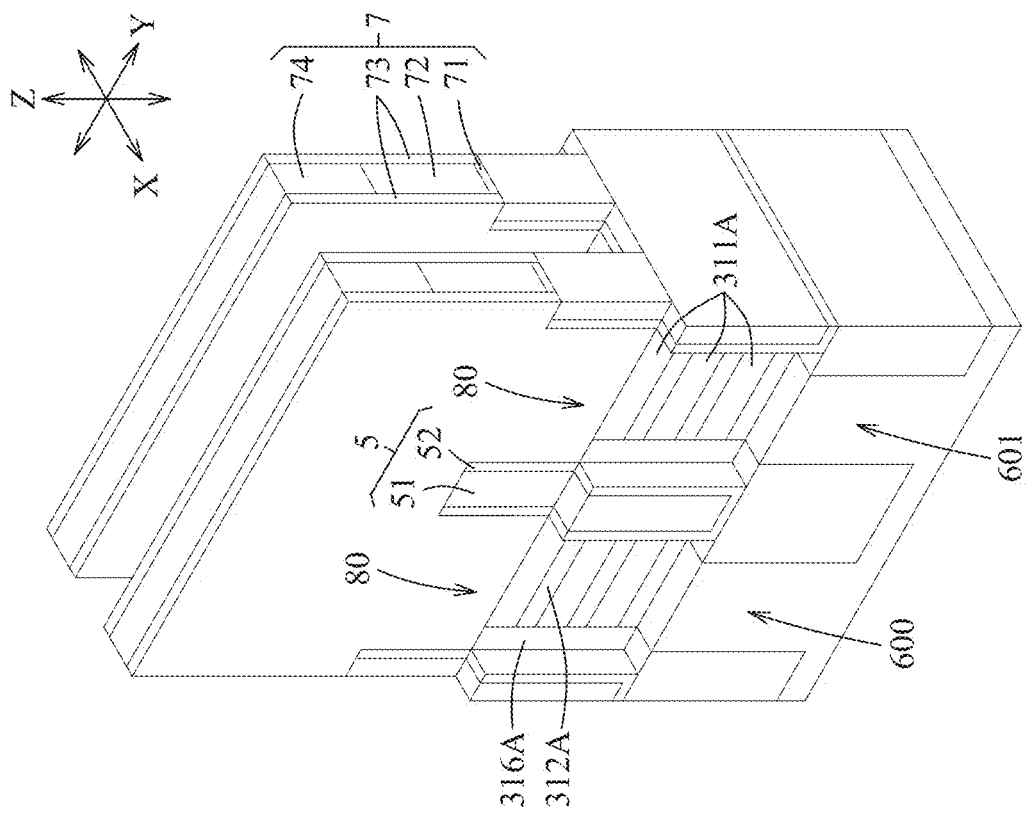
Figure 23G:
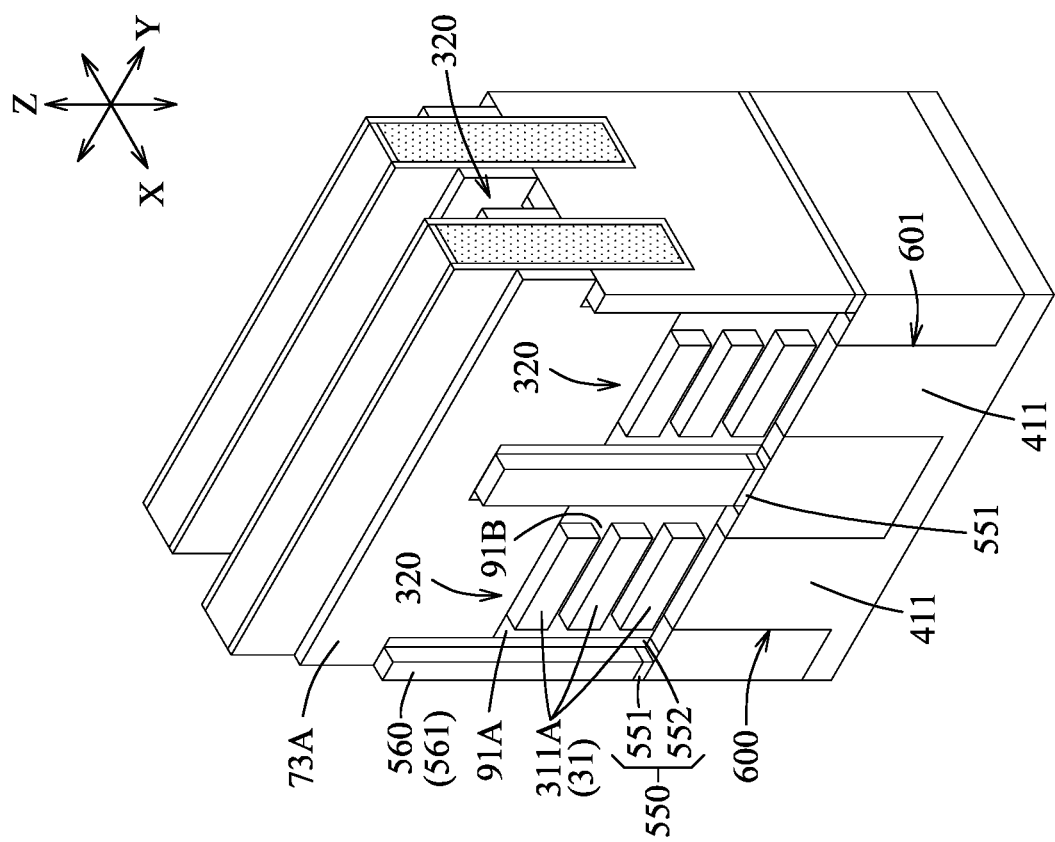

In the method 100, step 116 (step of trimming the isolation elements 525) is performed before step 117 (removal of the remaining regions of the sacrificial bodies 316A and remaining regions of the second nanosheet segments 312A). In the method 100', step 116 is performed to trim the isolation feature 52, and is performed after step 117 (removal of the remaining regions of the sacrificial bodies 316A and remaining regions of the second nanosheet segments 312A). To be specific, in the method 100', before trimming the isolation feature 52, the remaining regions of the sacrificial bodies 316A and remaining regions of the second nanosheet segments 312A (the elements 316A, 312A may have configurations similar to FIG. 17A) are removed to expose sidewalls of the isolation feature 52, as shown in FIG. 23F. After trimming the isolation feature 52, (i) sidewalls of the isolation body 51 are exposed, as shown in FIG. 23G, (ii) the trimmed isolation feature can serve as an isolation element 550 which is also shown in FIGS. 23A to 23C, and which has a lower element 551 and two U-shaped elements 552, and (iii) the remaining isolation body 51 after the trimming step is denoted by the numeral 560 which is disposed on the isolation element 550 and which includes an isolation portion 561 and two lateral portions 562. In the device 200C, as shown in FIGS. 23A to 23C, the lower element 551 is disposed between the gate portions 32' of the first and second semiconductor structures 600, 601, and the two U-shaped elements 552 are disposed to isolate the source/drain portions 30 and the channel portion 31 of the first semiconductor structure 600 from those of the second semiconductor structure 601. The isolation portion 561 is disposed on the lower element 551 to separate the first nanosheet segments 311A of the first semiconductor structure 600 from those of the second semiconductor structure 601, and the two lateral portions 562 are disposed in the U-shaped elements 552, respectively.

In some alternative embodiments, the devices 200A, 200B, 200C may further include additional features, and/or some features present in the devices 200A, 200B, 200C may be modified, replaced, or eliminated without departure from the spirit and scope of the present disclosure.

The embodiments of the present disclosure have the following advantageous features. By forming the isolation structure, the source/drain portions are prevented from merging with one another, which is beneficial for miniaturizing IC devices. In addition, by including a rare-earth element-containing dielectric material in the isolation structure, the isolation structure has improved ability to withstand ion bombardment due to rare-earth element by-products formed during ion bombardment having greater boiling points. Moreover, the rare-earth element-containing dielectric material has a dielectric constant that is lower than a dielectric constant of hafnium-based dielectric material, and thus, capacitance impact in the device can be reduced while providing protection to the isolation body. Additionally, with inclusion of the rare-earth element-containing dielectric material in the isolation structure, chlorine-based etching chemicals can be used to easily remove a portion of the isolation structure so as to enlarge a volume of the metal gate opening and at the same time, do not damage the channel portion (i.e., the first nanosheet segments) of the first and second semiconductor structures.

In accordance with some embodiments of the present disclosure, a device includes a first semiconductor structure, a second semiconductor structure, and an isolation structure disposed between the first and second semiconductor structures, and including a first dielectric material which has a dielectric constant higher than 8 and lower than 16.

In accordance with some embodiments of the present disclosure, the first dielectric material includes a rare-earth element.

In accordance with some embodiments of the present disclosure, the isolation structure includes an isolation element including the first dielectric material, and an isolation body including a second dielectric material that has a dielectric constant lower than that of the first dielectric material. The isolation element is disposed on the isolation body.

In accordance with some embodiments of the present disclosure, each of the first and second semiconductor structures includes source/drain portions, a channel portion disposed between two adjacent ones of the source/drain portions, and a gate portion disposed over the channel portion. The isolation structure is disposed to isolate the source/drain portions and the channel portion of the first semiconductor structure from those of the second semiconductor structure.

In accordance with some embodiments of the present disclosure, the channel portion has at least one nanosheet segment, and the gate portion surrounds the at least one nanosheet segment and includes a gate electrode and a gate dielectric. The gate dielectric has a first dielectric region that is disposed to separate the gate electrode from the at least one nanosheet segment, and a second dielectric region that is disposed to separate the gate electrode from the two adjacent ones of the source/drain portions.

In accordance with some embodiments of the present disclosure, each of the first and second semiconductor structures further includes an inner spacer disposed to separate the second dielectric region from the two adjacent ones of the source/drain portions.

In accordance with some embodiments of the present disclosure, the isolation structure includes an isolation element which includes the first dielectric material, and an isolation body which includes a second dielectric material that has a dielectric constant lower than that of the first dielectric material.

In accordance with some embodiments of the present disclosure, the isolation element is disposed on the isolation body and is located between the gate portions of the first and second semiconductor structures to permit a lower surface of the isolation element to be at a level higher than an upper surface of the at least one nanosheet segment. The isolation body is disposed to isolate the source/drain portions and the channel portion of the first semiconductor structure from those of the second semiconductor structure.

In accordance with some embodiments of the present disclosure, the isolation element includes an outer element including the first dielectric material, and an inner element including a third dielectric material having a dielectric constant lower than that of the first dielectric material. The inner element is surrounded by the outer element.

In accordance with some embodiments of the present disclosure, an upper surface of the isolation element has a dimension smaller than that of the lower surface of the isolation element.

In accordance with some embodiments of the present disclosure, the isolation element has a lower element disposed between the gate portions of the first and second semiconductor structures, and two U-shaped elements disposed to isolate the source/drain portions and the channel portion of the first semiconductor structure from those of the second semiconductor structure. The isolation body is disposed on the isolation element and includes an isolation portion disposed on the lower element to separate the at least one nanosheet segment of the first semiconductor structure from that of the second semiconductor structure, and two lateral portions disposed in the U-shaped elements, respectively.

In accordance with some embodiments of the present disclosure, a method includes: forming a first semiconductor structure and a second semiconductor structure; and forming an isolation structure between the first and second semiconductor structures, the isolation structure including a first dielectric material which has a dielectric constant higher than 8 and lower than 16.

In accordance with some embodiments of the present disclosure, the first dielectric material includes a rare-earth element.

In accordance with some embodiments of the present disclosure, each of the first and second semiconductor structures includes source/drain portions, a channel portion disposed between two adjacent ones of the source/drain portions, and a gate portion disposed over the channel portion. The isolation structure is disposed to isolate the source/drain portions and the channel portion of the first semiconductor structure from those of the second semiconductor structure.

In accordance with some embodiments of the present disclosure, a method includes: forming semiconductor structures each including a nanosheet stack which includes at least one first nanosheet, at least one second nanosheet alternating with the at least one first nanosheet; forming an isolation structure between two adjacent ones of the semiconductor structures, the isolation structure including a rare-earth element; forming a gate structure over the semiconductor structures and the isolation structure such that each of the semiconductor structures has two exposed portions at two opposite sides of the gate structure, the gate structure including a dummy dielectric, a dummy gate disposed on the dummy dielectric, and two gate spacers disposed at two opposite sides of a dummy stack of the dummy gate and the dummy dielectric; and forming two source/drain recesses respectively in the exposed portions of each of the semiconductor structures to form the at least one first nanosheet into at least one first nanosheet segment, and to form the at least one second nanosheet into at least one second nanosheet segment.

In accordance with some embodiments of the present disclosure, the isolation structure includes an isolation feature including the rare-earth element, and an isolation body including a dielectric material that has a dielectric constant lower than that of the isolation feature. The isolation feature is disposed on the isolation body so as to prevent damage of the isolation body when forming the source/drain recesses. Two sacrificial portions are disposed to respectively cover two opposite sides of the nanosheet stack of each of the semiconductor structures.

In accordance with some embodiments of the present disclosure, the method further includes: removing end regions of the at least one second nanosheet segment to form lateral recesses; removing lateral parts of the sacrificial portions to leave sacrificial bodies when forming the source/drain recesses; removing end regions of the sacrificial bodies to form inner gaps; forming first inner spacers respectively in the inner gaps; forming second inner spacers respectively in the lateral recesses; forming two source/drain portions respectively in the source/drain recesses of each of the semiconductor structures; and recessing a first portion of the isolation feature which is exposed from the gate structure of the isolation feature after forming the two source/drain recesses.

In accordance with some embodiments of the present disclosure, the method further includes: removing the dummy gate and the dummy dielectric; etching back the gate spacers; removing a remaining region of the at least one second nanosheet segment and remaining regions of the sacrificial bodies; trimming the a second portion of the isolation feature which is exposed after removal of the dummy dielectric to partially expose the isolation body; and forming a gate portion to surround the at least one first nanosheet segment of each of the semiconductor structures, the gate portion including a gate electrode and a gate dielectric having a first dielectric region that is disposed to separate the gate electrode from the at least one first nanosheet segment of a corresponding one of the semiconductor structures, and a second dielectric region that is disposed to separate the gate electrode from the two source/drain portions formed on a corresponding one of the semiconductor structures.

In accordance with some embodiments of the present disclosure, the trimming of the second portion of the isolation feature is performed before removing the remaining region of the at least one second nanosheet segment and the remaining regions of the sacrificial bodies.

In accordance with some embodiments of the present disclosure, the trimming of the second portion of the isolation feature is performed after removing the remaining region of the at least one second nanosheet segment and the remaining regions of the sacrificial bodies.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming semiconductor structures each including a nanosheet stack which includes at least one first nanosheet, at least one second nanosheet alternating with the at least one first nanosheet;
forming an isolation structure between two adjacent ones of the semiconductor structures, the isolation structure including an isolation feature including a rare-earth element;
forming a gate structure over the semiconductor structures and the isolation structure such that each of the semiconductor structures has two exposed portions at two opposite sides of the gate structure, the gate structure including a dummy dielectric, a dummy gate disposed on the dummy dielectric, and two gate spacers disposed at two opposite sides of a dummy stack of the dummy gate and the dummy dielectric;
forming two source/drain recesses respectively in the exposed portions of each of the semiconductor structures to form the at least one first nanosheet into at least one first nanosheet segment, and to form the at least one second nanosheet into at least one second nanosheet segment;
recessing a first portion of the isolation feature which is exposed from the gate structure after forming the two source/drain recesses;
removing end regions of the at least one second nanosheet segment to form lateral recesses so as to leave a remaining region of the at least one second nanosheet segment;
forming inner spacers respectively in the lateral recesses;
forming two source/drain portions respectively in the source/drain recesses of each of the semiconductor structures;
removing the dummy gate and the dummy dielectric;
removing the remaining region of the at least one second nanosheet segment;
after removing the dummy dielectric and before removing the remaining region of the at least one second nanosheet segment, trimming a second portion of the isolation feature which is exposed after removal of the dummy dielectric; and
forming a gate portion to surround the at least one first nanosheet segment of each of the semiconductor structures, the gate portion including a gate electrode and a gate dielectric having a first dielectric region that is disposed to separate the gate electrode from the at least one first nanosheet segment of a corresponding one of the semiconductor structures, and a second dielectric region that is disposed to separate the gate electrode from the two source/drain portions formed on a corresponding one of the semiconductor structures.

2. The method as claimed in claim 1, wherein:
the isolation structure further includes an isolation body including a dielectric material that has a dielectric constant lower than a dielectric constant of the isolation feature;
the isolation feature is disposed on the isolation body so as to prevent damage of the isolation body when forming the source/drain recesses; and
in forming the semiconductor structures, two sacrificial portions are disposed to respectively cover two opposite sides of the nanosheet stack of each of the semiconductor structures.

3. The method as claimed in claim 2, further comprising:
removing lateral parts of the sacrificial portions to leave sacrificial bodies when forming the source/drain recesses;
in removing end regions of the at least one second nanosheet segment, removing end regions of the sacrificial bodies to form inner gaps; and
in forming the inner spacers, forming other inner spacers respectively in the inner gaps.

4. The method as claimed in claim 3, further comprising:
etching back the gate spacers after removing the dummy gate.

5. A method comprising:
forming semiconductor structures respectively on substrate segments, each of the substrate segments being spaced apart from each other, each of the semiconductor structures including a material stack having first layers and second layers that alternate with the first layers;
forming a trench isolation element between the substrate segments;
forming an isolation structure over the trench isolation element between the semiconductor structures, the isolation structure including a first dielectric material which has a dielectric constant higher than 8 and lower than 16;
forming a gate structure over the semiconductor structures and the isolation structure, the gate structure including a dummy dielectric and a dummy gate, each of the semiconductor structures having two exposed portions exposed from the gate structure;
removing the two exposed portions to form source/drain recesses, the first layers and the second layers being formed into first segments and second segments, respectively;
forming source/drain portions in the source/drain recesses, respectively;
removing the dummy gate and the dummy dielectric;
removing the second segments; and
after removing the second segments, the dummy dielectric and the dummy gate, forming a metal gate structure around the first segments,
wherein the isolation structure includes an isolation feature that includes the first dielectric material, and an isolation body that includes a second dielectric material having a dielectric
wherein the isolation feature is disposed on the isolation body, and
wherein the isolation feature includes
an outer element that includes the first dielectric material, and
an inner element that includes a third dielectric material having a dielectric constant lower than a dielectric constant of the first dielectric material.

6. The method as claimed in claim 5, wherein the first dielectric material includes a rare-earth element.

7. The method as claimed in claim 5, wherein after forming the gate structure, the isolation feature has an isolation element covered by the gate structure and two lateral elements without being covered by the gate structure.

8. The method as claimed in claim 7, the method further comprising:

removing the two lateral elements after forming the source/drain recesses; and forming contact etch stop layers and interlayer dielectrics after forming the source/drain portions.

9. The method as claimed in claim 7, further comprising trimming the isolation element after removing the dummy gate and the dummy dielectric, and prior to removing the second segments.

10. The method as claimed in claim 9, wherein after trimming the isolation element, an upper surface of the trimmed isolation element has a dimension smaller than a lower surface of the trimmed isolation element.

11. The method as claimed in claim 7, further comprising trimming the isolation elements after removing the dummy gate, the dummy dielectric, and the second segments.

12. A method comprising:
forming semiconductor structures respectively on substrate segments, each of the substrate segments being spaced apart from each other, each of the semiconductor structures including a material stack having first layers and second layers that alternate with the first layers;
forming an isolation structure between the semiconductor structures, the isolation structure including an isolation feature which includes a first dielectric material;
forming a gate structure over the semiconductor structures and the isolation structure, the gate structure including a dummy dielectric and a dummy gate, each of the semiconductor structures having two exposed portions exposed from the gate structure, the isolation structure having an isolation element covered by the gate structure and two lateral elements without being covered by the gate structure;
removing the exposed portions to form source/drain recesses, the first layers and the second layers being formed into first segments and second segments, respectively; and
after forming the source/drain recesses, removing the two lateral elements of the isolation structure.

13. The method as claimed in claim 12, wherein
the isolation feature includes the isolation element and the two lateral elements, and the first dielectric material includes a rare-earth element,
the isolation structure further includes an isolation body that includes a second dielectric material having a dielectric constant lower than a dielectric constant of the first dielectric material and that is covered by the isolation feature, and
removing the two lateral elements includes removing upper parts of the two lateral elements during forming the source/drain recesses, leaving remaining parts of the two lateral elements covering the isolation body during forming the source/drain recesses.

14. The method as claimed in claim 13, wherein in forming the source/drain recesses, a reactive-ion etching process is used to permit ions of a halogen element to react with the rare-earth element so as to form a by-product layer over the remaining parts of the two lateral elements, the by-product layer including $REX_j$, where RE refers to the rare-earth element, X refers to the halogen element, and j is a positive number.

15. The method as claimed in claim 14, further comprising forming contact etch stop layers and interlayer dielectrics after forming the source/drain portions,
wherein the by-product layer and the remaining parts of the two lateral elements are removed after forming the source/drain recesses and before forming the contact etch stop layers and interlayer dielectrics.

16. The method as claimed in claim 13, wherein the isolation body includes a dielectric film, and a dielectric body surrounded by the dielectric film, a material of the dielectric film being different from a material of the dielectric body.

17. The method as claimed in claim 12, further comprising:
forming source/drain portions in the source/drain recesses, respectively;
removing the dummy gate and the dummy dielectric;
removing the second segments; and
after removing the second segments, the dummy dielectric and the dummy gate, forming a metal gate structure around the first segments.

18. The method as claimed in claim 17, further comprising trimming the isolation feature after completely removing the second segments.

19. The method as claimed in claim 12, wherein
the isolation structure further includes an isolation body including a second dielectric material having a dielectric constant lower than a dielectric constant of the first dielectric material, the isolation body being separated from the semiconductor structures by the isolation feature, and
an upper portion of the isolation body and an upper portion of the isolation feature together form a combination of the isolation element and the two lateral elements.

20. The method as claimed in claim 12, wherein the first dielectric material has a dielectric constant higher than 8 and lower than 16.

* * * * *